United States Patent
Fan et al.

(10) Patent No.: US 10,734,899 B2
(45) Date of Patent: Aug. 4, 2020

(54) DC-DC CONVERTER WITH A PULSE-SKIPPING MODE (PSM) TRANSITIONS CONTROLLER

(71) Applicant: TEXAS INSTRUMENTS INCORPORATED, Dallas, TX (US)

(72) Inventors: Jiwei Fan, Cary, NC (US); Mingyue Zhao, Cary, NC (US); Huy Le Nhat Nguyen, Raleigh, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/259,194

(22) Filed: Jan. 28, 2019

(65) Prior Publication Data

US 2020/0212800 A1 Jul. 2, 2020

Related U.S. Application Data

(60) Provisional application No. 62/786,862, filed on Dec. 31, 2018.

(51) Int. Cl.

| | |
|---|---|
| *H02M 3/158* | (2006.01) |
| *H02M 1/14* | (2006.01) |
| *H03K 7/08* | (2006.01) |
| *H03K 4/50* | (2006.01) |
| *H02M 1/08* | (2006.01) |
| *H03K 19/20* | (2006.01) |
| *H02M 1/00* | (2006.01) |

(52) U.S. Cl.
CPC ............ *H02M 3/158* (2013.01); *H02M 1/08* (2013.01); *H02M 1/14* (2013.01); *H03K 4/50* (2013.01); *H03K 7/08* (2013.01); *H03K 19/20* (2013.01); *H02M 2001/0003* (2013.01)

(58) Field of Classification Search
CPC ....... H02M 3/156; H02M 3/158; H02M 3/157
USPC ................................ 323/222, 271, 282–285
See application file for complete search history.

(56) References Cited

U.S. PATENT DOCUMENTS

| | | | |
|---|---|---|---|
| 2007/0257647 A1* | 11/2007 | Chen | ....... H02M 3/157 323/282 |
| 2010/0201336 A1* | 8/2010 | Chen | ....... H02M 3/1588 323/285 |
| 2015/0194880 A1* | 7/2015 | Wibben | ....... H02M 3/156 323/282 |

\* cited by examiner

*Primary Examiner* — Nguyen Tran
(74) *Attorney, Agent, or Firm* — Mark Allen Valetti; Charles A. Brill; Frank D. Cimino

(57) ABSTRACT

A system includes an input voltage supply and advanced current mode (ACM) converter device coupled to the input voltage supply. The ACM converter device (102) includes a pulse-skipping mode (PSM) transitions controller configured to switch between PSM and discontinuous conduction mode (DCM). The system also includes an output inductor coupled to a switch node of the ACM converter device. The system also includes an output capacitor with a first terminal coupled to the output inductor and a second terminal coupled to a ground node. The system also includes a voltage divider in parallel with the output capacitor, where the voltage divider is configured to provide a feedback voltage to the ACM converter device.

8 Claims, 25 Drawing Sheets

ONCE DCM IS REACHED THERE IS A DISCONNECT BETWEEN $V_{RAMP}$ AND $I_L$

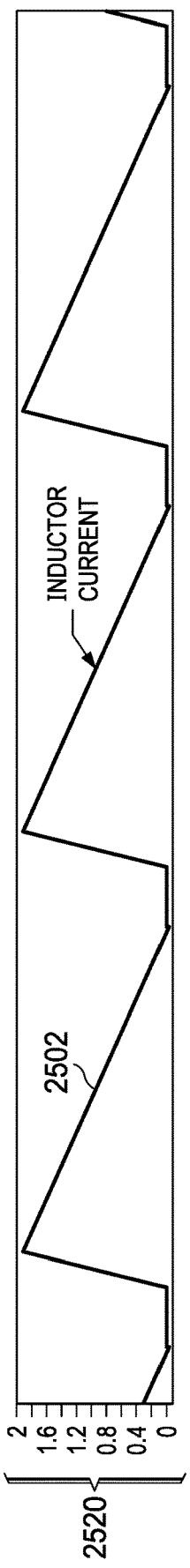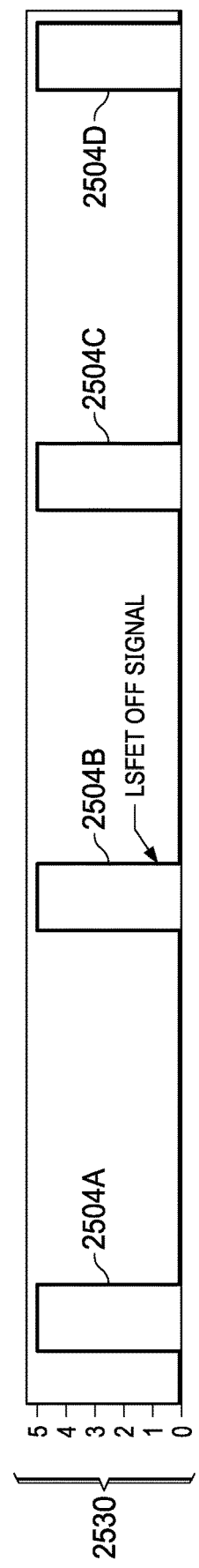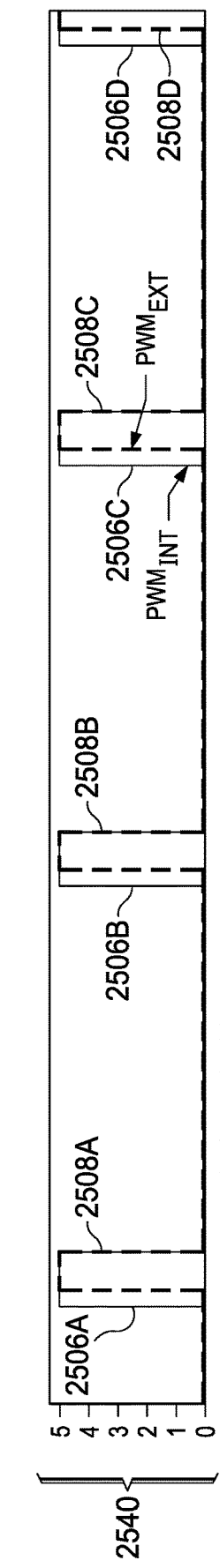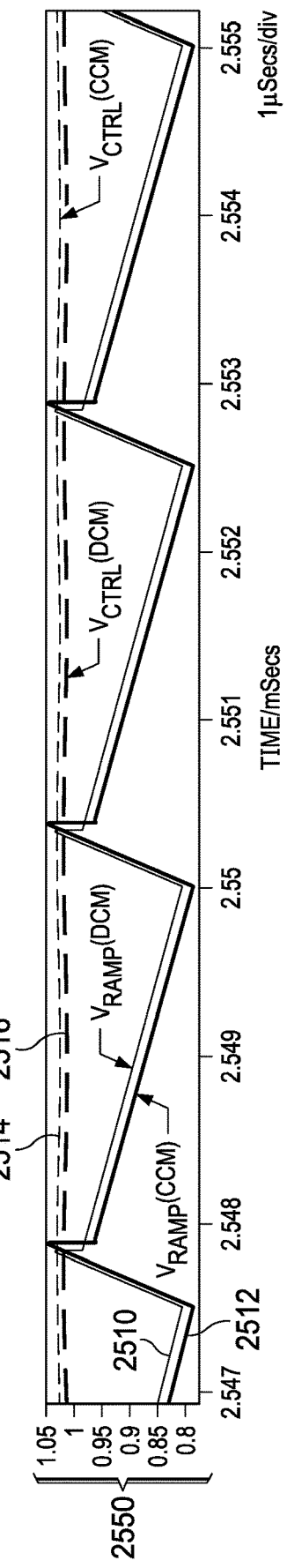
FIG. 25

FIG. 30
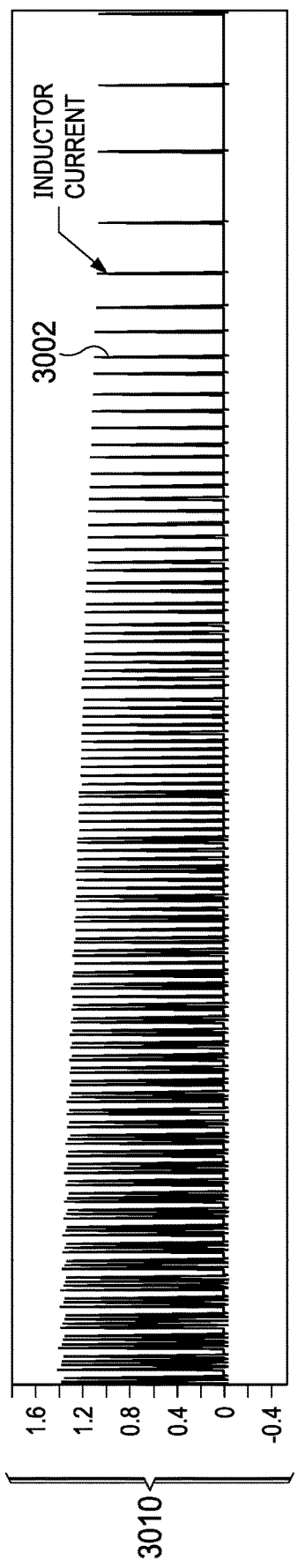
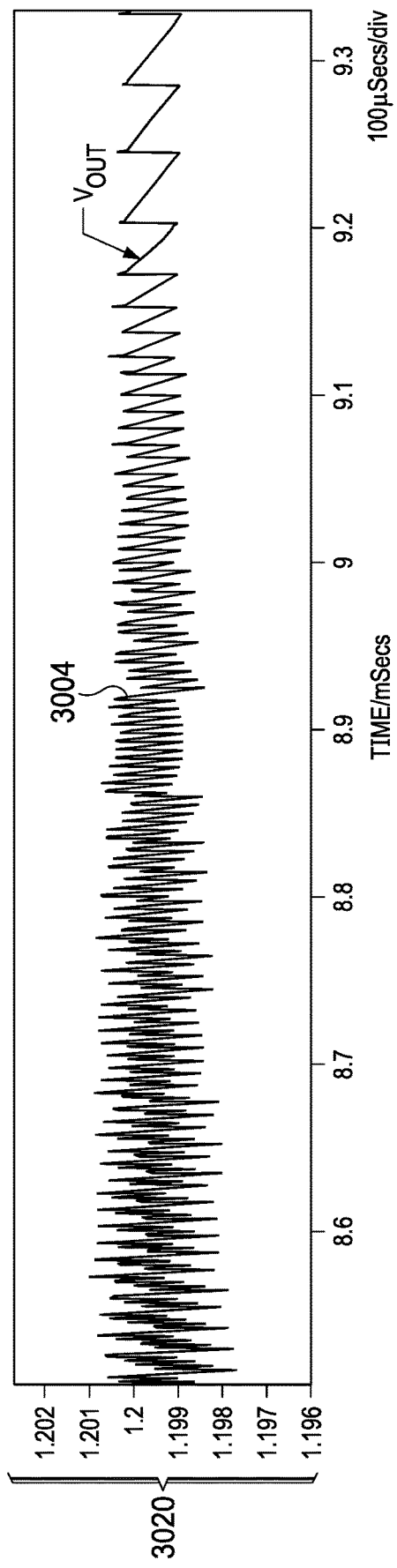

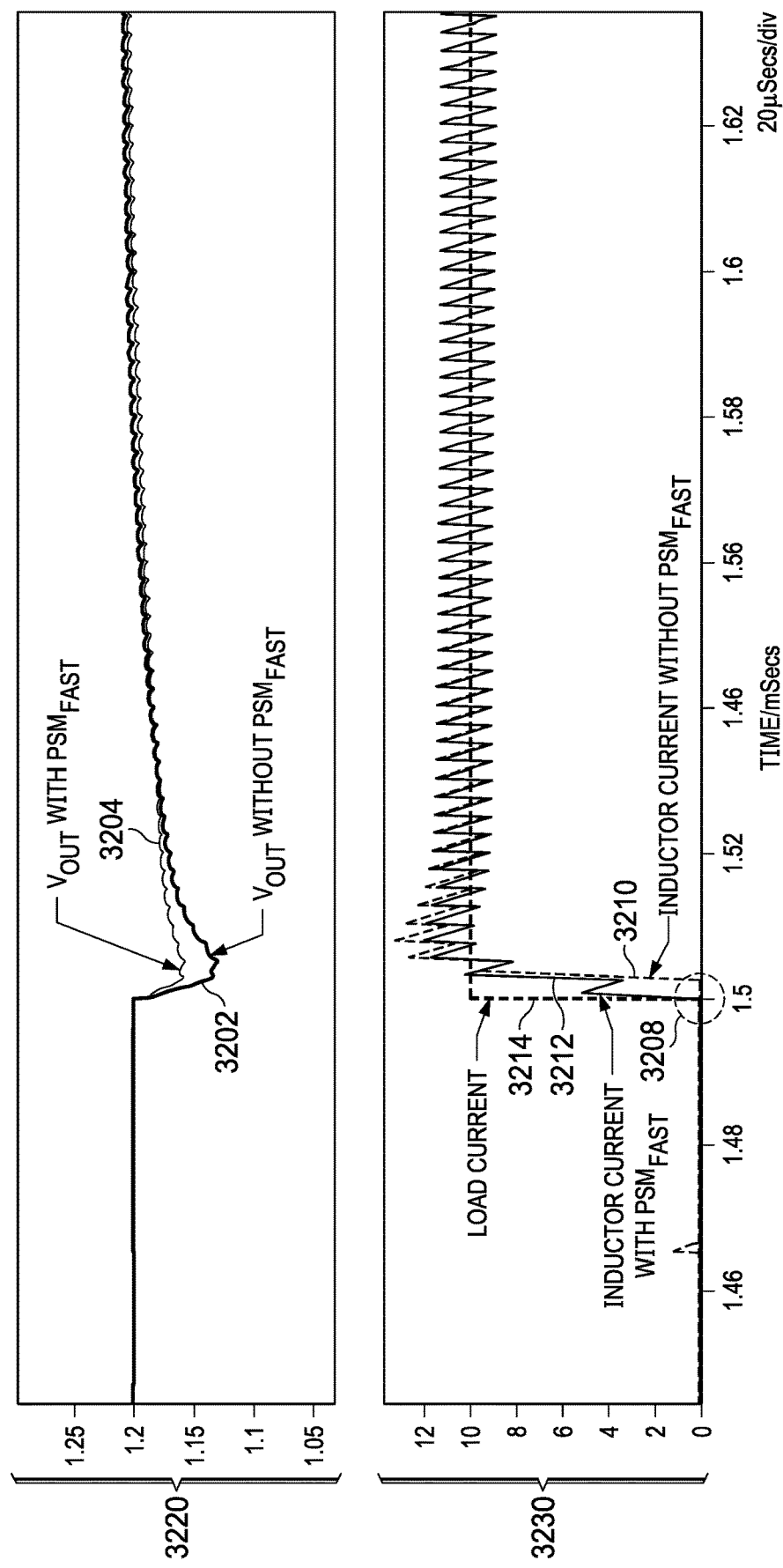

DC-DC CONVERTER WITH A PULSE-SKIPPING MODE (PSM) TRANSITIONS CONTROLLER

CROSS-REFERENCE TO RELATED APPLICATION(S)

This application claims priority to U.S. Provisional Application No. 62/786,862, filed Dec. 31, 2018, titled "DC-DC Converter With A Pulse-Skipping Mode (PSM) Transitions Controller", which is hereby incorporated by reference in its entirety.

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. Modern electronic systems often employ devices or components designed to operate using different DC voltages. Accordingly, different DC-DC converters, or a DC-DC converter that supports a wide range of output voltages, are needed for such systems.

There are many different DC-DC converter topologies. The available topologies differ with regard to the components used, the amount of power handled, the input voltage (s), the output voltage(s), efficiency, reliability, size and/or other characteristics. Some ongoing innovation efforts for DC-DC converters involve improving efficiency (reducing losses). Two example sources of losses in DC-DC converters are switching losses and conduction losses. An ideal efficiency control scheme would be able to monitor the load current and instantaneously adjust switching parameters and/or the amount of current conveyed per switch cycle. This ideal efficiency control scheme is not possible due to detection/response delays and/or other imperfections.

SUMMARY

In accordance with at least one example of the disclosure, a system comprising an input voltage supply and advanced current mode (ACM) converter device coupled to the input voltage supply. The ACM converter device comprises a pulse-skipping mode (PSM) transitions controller configured to switch between PSM and discontinuous conduction mode (DCM). The system also comprises an output inductor coupled to a switch node of the ACM converter device. The system also comprises an output capacitor with a first terminal coupled to the output inductor and a second terminal coupled to a ground node. The system also comprises a voltage divider in parallel with the output capacitor, where the voltage divider is configured to provide a feedback voltage to the ACM converter device.

In accordance with at least one example of the disclosure, a device comprises a DC-DC converter with a mode controller configured to switch between a continuous conduction mode (CCM), DCM, and PSM. The mode controller comprises a voltage loop circuit, a ramp loop circuit, and a loop comparator. The mode control also comprises a pulse-width modulation (PWM) circuit configured to generate a first PWM signal that runs in every clock cycle to drive a ramp voltage for the ramp loop circuit, and to generate a second PWM signal that is skipped according to load condition when the DC-DC converter is in PSM.

In accordance with at least one example of the disclosure, a device comprises a DC-DC converter with a driver circuit coupled to a mode controller. The mode controller comprises a PMW circuit and a ramp loop circuit coupled to a first output node (e.g., a $PWM_{INT}$ node herein) of the PWM circuit. The mode controller also comprises a first comparator coupled to output nodes of the ramp loop circuit and to voltage loop circuit. The mode controller also comprises a second comparator coupled to a feed forward output node of the voltage loop circuit. The driver circuit is coupled to a second output node of the PWM circuit. Also, a first input node of the PWM circuit is coupled to an output node of the first comparator. Also, a second input node of the PWM circuit is coupled to an output node of the second comparator.

BRIEF DESCRIPTION OF THE DRAWINGS

For a detailed description of various examples, reference will now be made to the accompanying drawings in which:

FIG. 25 is a graph showing mode controller waveforms when a converter is operating in discontinuous conduction mode (DCM) in accordance with various examples;

FIG. 30 is a graph showing inductor current and $V_{OUT}$ changes in PSM mode in accordance with various examples;

FIG. 32 is a graph showing a comparison of transients with and without a PSMCMP$_{FAST}$ comparator in accordance with various examples.

DETAILED DESCRIPTION

Figure 1:
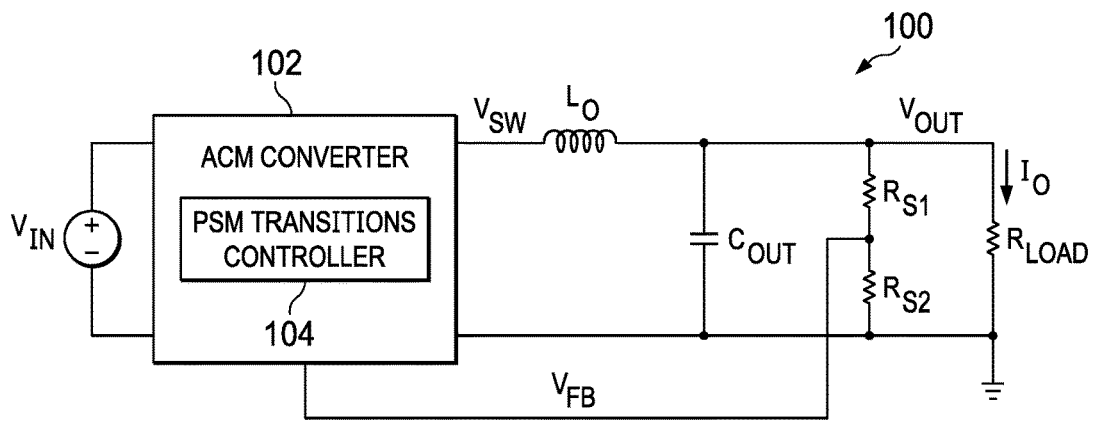
FIG. 1 is a block diagram showing a system in accordance with various examples.

Disclosed herein are DC-DC converter systems, devices, and methods involving a mode controller configured to manage transitions between discontinuous conduction mode (DCM) and pulse-skipping mode (PSM). In some examples, the mode controller is configured to switch between continuous conduction mode (CCM), DCM, and PSM. An example DC-DC converter system includes an input voltage supply and advanced current mode (ACM) converter device coupled to the input voltage supply. The ACM converter device comprises a mode controller (sometimes referred to as a PSM transitions controller) configured to switch between PSM and DCM. The DC-DC converter system also includes an output inductor coupled to a switch node of the ACM converter device. The DC-DC converter system also includes an output capacitor with a first terminal coupled to the output inductor and a second terminal coupled to a ground node. The DC-DC converter system also includes a voltage divider in parallel with the output capacitor, where the voltage divider is configured to provide a feedback voltage to the ACM converter device.

In the disclosed DC-DC converter systems, devices, and methods, the mode controller is configured to provide true fixed frequency with internal compensation and PSM transitions. In contrast to the disclosed mode controller operations, a first inferior control option involves fixed frequency converters without external compensation, but pulse frequency modulation (PFM) is based on burst mode which normally have much higher $V_{OUT}$ ripple. This first inferior control option is based on peak current mode control with limitation on the internal compensation (to cover wide stability range), such that the internal loop compensation and slope compensation cannot be optimized to achieve fast transient. The first inferior control option is suitable for small load current applications due to current sensing difficulties with big load current. With the first inferior control option, Boundary Conduction Mode (like burst mode) results in a $V_{OUT}$ ripple that is much higher in a PFM mode than in CCM.

A second inferior control option involves pseudo fixed frequency converters supporting single pulse PFM without external compensation, but the frequency varies during transients. With the second inferior control option, Constant On Time control, or hysteresis control with PLL may be used. Also, with the second inferior control option fast load transient response is provided, but the switching frequency has to change during transient, resulting in higher electromagnetic interference (EMI) risk. With the second inferior control option larger jitter becomes an issue when designing loop bandwidth aggressively, which is also not suitable for EMI sensitive applications.

With the disclosed DC-DC converter systems, devices, and methods, the mode controller provides ACM control with transition to PSM, where single pulse PFM provides true fixed frequency operation and fast transient response without using external compensation. With the disclosed mode controller operations, the $V_{OUT}$ ripple in DCM and PSM mode is very small and mode transitions (e.g., DCM to PSM, or PSM to DCM) are very smooth.

In some examples, the mode controller includes a voltage loop circuit with an integrator, gain and level shifters, and a transient feed forward circuit. The integrator makes the system DC offset small. The gain and level shifters move the control voltages to the common voltage level for DCM/PSM. The transient feed forward circuit adds a zero to system to make the transient faster. The mode controller also includes a ramp loop circuit that includes a ramp generator and slope compensation circuit. The ramp generator generates a ramp voltage around the common voltage. The slope compensation circuit maintains the slope compensation at a target value. The mode controller also includes a loop comparator and PWM circuit to support smooth transition between CCM, DCM, and PSM. The loop comparator and PWM circuit combines voltage loop and ramp loop outputs to generate the PWM signal. Also, the loop comparator and PWM circuit includes two PSM comparators to keep transitions between PSM, DCM and CCM smooth and fast. Various mode controller details and options are further described herein. To provide a better understanding, various DC-DC converter system options, device options, and method options involving a mode controller configured to manage transitions between PSM and DCM are described using the figures as follows.

FIG. 1 is a block diagram showing a system 100 in accordance with various examples. In the example of FIG. 1, the system 100 is an example of a DC-DC converter system, a consumer device, or a unit. As shown, the system 100 includes an ACM converter 102 with a PSM transitions controller 104, where the ACM converter 102 generates a switch node voltage ($V_{SW}$) based on an input supply voltage ($V_{IN}$). $V_{SW}$ is provided to an output inductor ($L_O$) and an output capacitor ($C_{out}$). As shown in FIG. 1, $L_O$ has a first terminal coupled to the ACM converter 102 (e.g., a switch node of ACM converter 102) and a second terminal coupled to a first terminal of $C_{OUT}$. The second terminal of $C_{out}$ is coupled to a ground node, where the voltage level between $C_{OUT}$ and ground is $V_{OUT}$. In parallel with $C_{OUT}$ is a voltage divider with two resistors ($R_{s1}$ and $R_{s2}$), where $V_{OUT}$ is provided to the voltage divider. $V_{OUT}$ is also provided to a load ($R_{LOAD}$), where the output current ($I_{LOAD}$) is a function of $R_{LOAD}$. As shown, the voltage level between $R_{s1}$ and $R_{s2}$ is provided to the ACM converter 102 as a feedback voltage ($V_{FB}$). In operation, the PSM transitions controller 104 uses $V_{FB}$ and the control schemes described herein to transition between CCM, DCM, and PSM depending on $R_{load}$ as a function of time.

In some example, the ACM converter 102 only needs a $V_{FB}$ pin for the control loop (external compensation is avoided). Thus, external passive components can be minimized to reduce total system cost and size. Also, proportional-integral-derivative (PID) compensation or proportional-integral (PI) compensation with the ACM converter 102 is avoided. In the example of FIG. 1, the ACM converter 102 represents a Buck converter, where the PSM transitions controller 104 uses $V_{FB}$ and the control schemes. In some examples (e.g., for high load current applications), two sensing lines may be necessary to support remote sensing. Also, in some examples, a feedforward capacitor can be added across $R_{s1}$ to further improve the transient response.

Figure 2:
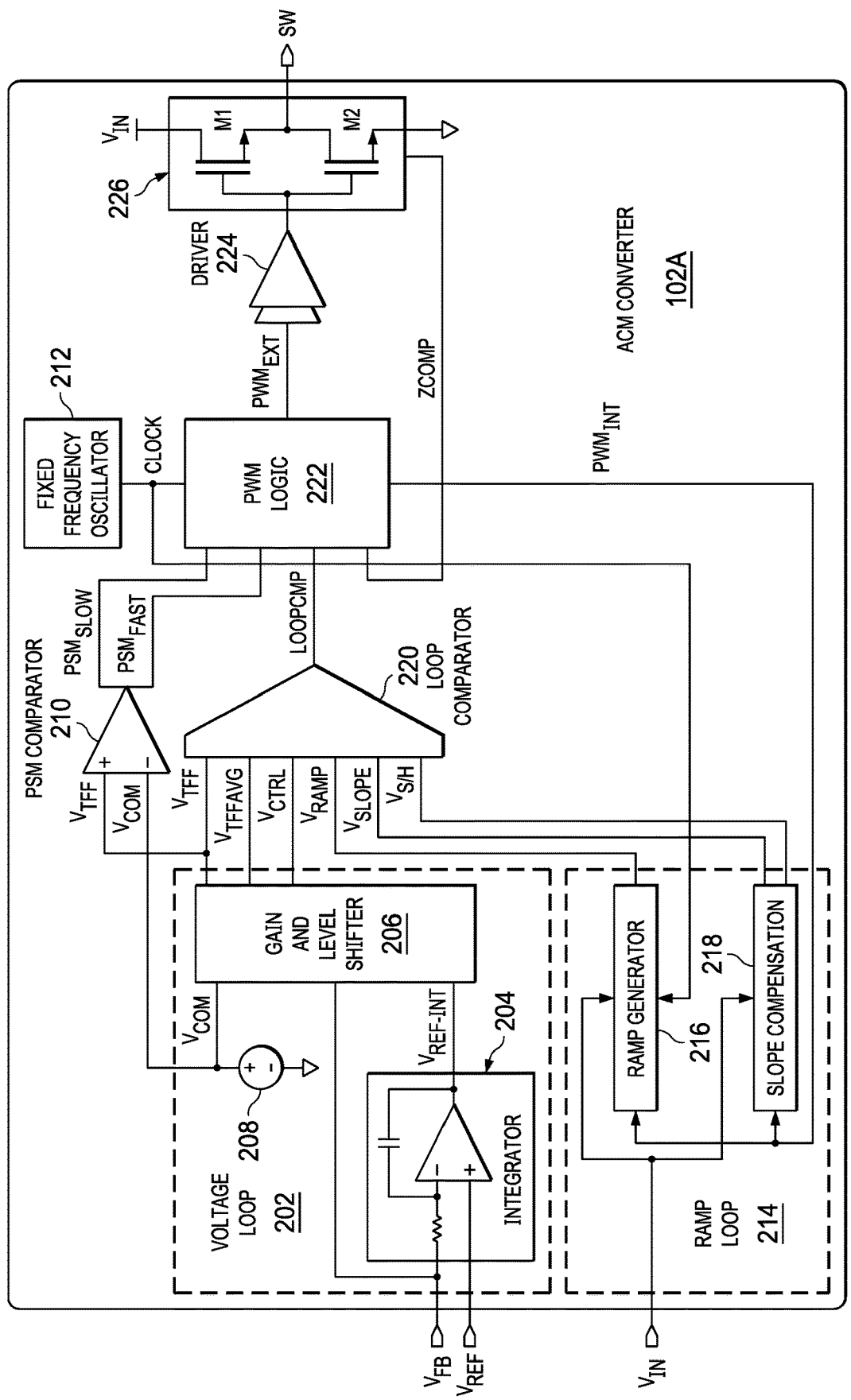
FIG. 2 is a block diagram showing an advanced current mode (ACM) converter with mode controller components in accordance with various examples.

FIG. 2 is a block diagram showing an ACM converter 102A (an example of the ACM converter 102 in FIG. 1) with mode controller components in accordance with various examples. In the example of FIG. 2, the ACM converter 102A includes a voltage loop circuit 202 that receives $V_{FB}$ and a reference voltage ($V_{REF}$) as inputs. More specifically, the voltage loop circuit 202 includes an integrator 204, and gain and level shifter circuit 206. As shown, the integrator receives $V_{FB}$ and $V_{REF}$ as inputs and provides an integration output ($V_{REF-INT}$). The gain and level shifter circuit 206 receives $V_{REF-INT}$ as an input along with a common voltage ($V_{COM}$) provided by a voltage supply 208. The outputs of the gain and level shifter circuit 206 include a feed forward voltage ($V_{TFF}$), an averaged feed forward voltage ($V_{TFFAVG}$), and a control voltage ($V_{CTRL}$), where $V_{TFF}$, $V_{TFFAVG}$, and $V_{CTRL}$ are provided to a loop comparator 220.

In the example of FIG. 2, the loop comparator 220 also receives voltage levels from a ramp loop circuit 214. As shown, the ramp loop circuit 214 includes a ramp generator circuit 216 and a slope compensation circuit 218. More specifically, the ramp generator circuit 216 outputs a ramp voltage ($V_{RAMP}$) to the loop comparator 220. Meanwhile, the slope compensation circuit 218 outputs a slope voltage ($V_{SLOPE}$) and a sample and hold voltage ($V_{S/H}$). The loop comparator 220 outputs comparison result signal (LOOPCMP) to a PWM circuit 222.

In the example of FIG. 2, the PWM circuit 222 also receives a first PSM signal ($PSM_{SLOW}$) and a second PSM signal ($PSM_{FAST}$), where $PSM_{SLOW}$ and $PSM_{FAST}$ are output from a PSM comparator circuit 210. More specifically, the PSM comparator circuit 210 generates $PSM_{SLOW}$ and $PSM_{FAST}$ from $V_{TFF}$ and $V_{COM}$. In some examples, the PWM circuit 222 also receives another zero current comparison signal ($Z_{COMP}$) from a switch set 226 (with two transistors—M1 and M2), where the switch set 226 is driven by a driver circuit 224 coupled to the PWM circuit 222. The PWM circuit 222 also received a clock signal from a fixed frequency oscillator 212. Using the various inputs ($PSM_{SLOW}$, $PSM_{FAST}$, LOOPCMP, and $Z_{COMP}$) and the clock signal from the fixed frequency oscillator 212, the PWM circuit 222 is configured to provide a first PWM signal ($PWM_{EXT}$) and a second PWM signal ($PWM_{INT}$), where $PWM_{EXT}$ is output to the driver circuit 224, and where $PWM_{INT}$ is provided to the ramp loop circuit 214. More specifically, $PWM_{INT}$ is received by the ramp generator circuit 216 and the slope compensation circuit 218.

In the example of FIG. 2, the various components represented for the ACM converter 102A correspond to the PSM transitions controller 104 of FIG. 1. In operation, the voltage loop circuit 202 senses and process the error signal from $V_{FB}$. More specifically, the integrator 204 senses the difference between $V_{FB}$ and $V_{REF}$, and generates $V_{REF-INT}$. The integrator 204 eliminates the DC errors in for the ACM converter 102A. In some examples, the time constant of the integrator 204 is very low. In some examples, the gain and level shifter circuit 206 amplifies the error between $V_{FB}$ and $V_{REF-INT}$ with a fixed gain around 5~10×. The amplified error is added/shifted to $V_{COM}$, resulting in $V_{CTRL}$ being output from the gain and level shifter circuit 206. In some examples, transient feed forward operations are used to improve the transient response speed.

In the example of FIG. 2, the ramp loop circuit 214, generates $V_{RAMP}$ according to $V_{IN}$ and $PWM_{INT}$. The slope compensation circuit 216 is needed for duty cycle larger than 50%. More specifically, the ramp generator circuit 216 changes the ramp slope according to $V_{IN}$. When $PWM_{INT}$ is high, $V_{RAMP}$ is high. When $PWM_{INT}$ is low, $V_{RAMP}$ is low. The slope compensation circuit 218 generates a sawtooth waveform which has a slope equal to the down slope of $V_{RAMP}$.

In operation, the loop comparator 220 adds up the input signals ($V_{TFF}$, $V_{TFFAVG}$, $V_{CTRL}$, $V_{RAMP}$, $V_{SLOPE}$, $V_{S/H}$) together and terminates the PWM cycle when the sum of positive inputs is higher than the sum of negative inputs. The PSM comparator circuit 210 compares $V_{TFF}$ and $V_{COM}$ to decide when to block $PWM_{EXT}$ from $PWM_{INT}$. As previously noted, the PWM circuit 222 generates $PWM_{INT}$ and $PWM_{EXT}$ using the clock signal from the fixed frequency oscillator 212 and the output of the loop comparator 220. The PWM circuit 222 also include components to support transitions between, CCM, DCM, and PSM.

Figure 3:
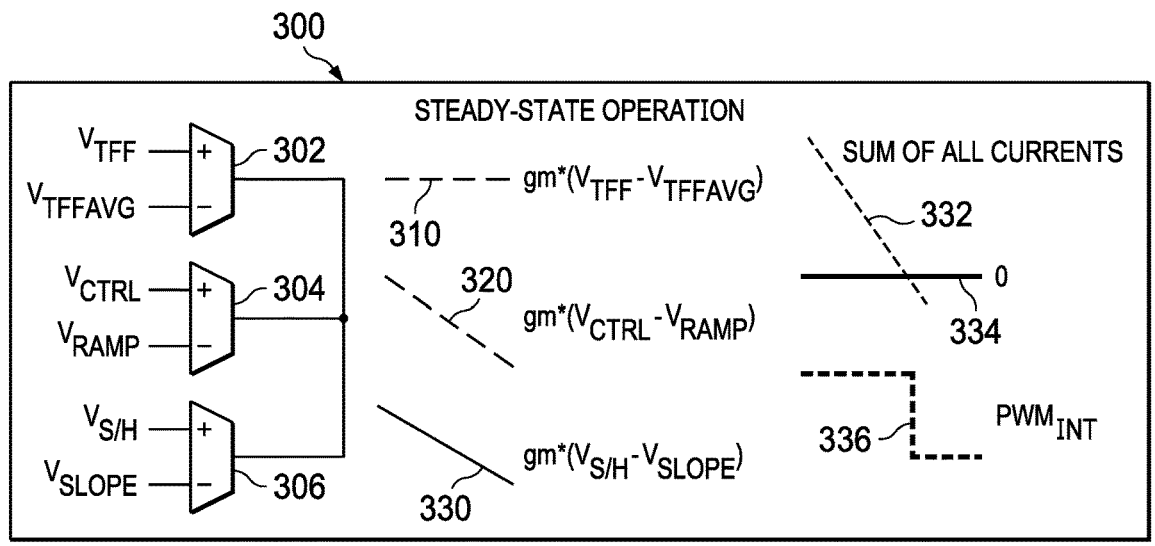
FIG. 3 is a circuit and graph showing a loop comparator scenario for a mode controller in accordance with various examples.

FIG. 3 is a circuit and graph showing a loop comparator scenario 300 for a mode controller in accordance with various examples. In the loop comparator scenario 300, the comparators 302, 304 and 306 represent components of a loop comparator such as the loop comparator 220 in FIG. 2. More specifically, the comparator 302 compares $V_{TFF}$ and $V_{TFFAVG}$, the comparator 304 compares $V_{CTRL}$ and $V_{RAMP}$, and the comparator 306 compares $V_{S/H}$ and $V_{SLOPE}$.

In the loop comparator scenario 300, line 310 represents the output of the comparator 302, where the output is given as: $gm^*(V_{TFF}-V_{TFFAVG})$. Meanwhile, line 320 represents the output of the comparator 304, where the output is given as: $gm^*(V_{CTRL}-V_{RAMP})$. Also, line 330 represents the output of the comparator 306, where the output is given as: $gm^*(V_{S/H}-V_{SLOPE})$. The sum of lines 310, 320, and 330 are represented by line 332, which is shown relative to a zero slope line 334. In the example of FIG. 3, the combination of the comparator 302, 304, and 306 (represented by line 332) results in $PWM_{INT}$ transitioning from high to low.

Figure 4:
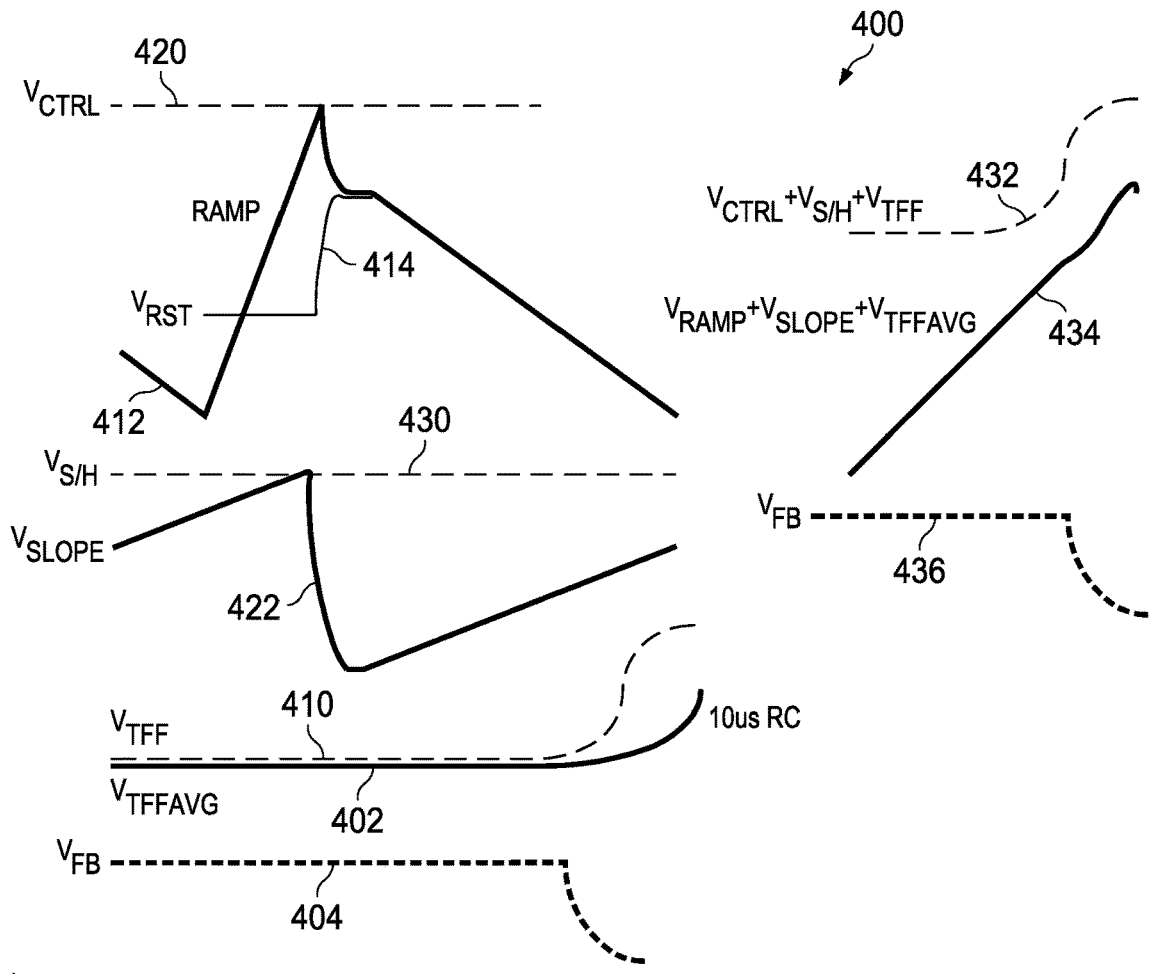
FIG. 4 is a graph showing a comparator results for a mode controller in accordance with various examples.

FIG. 4 is a graph 400 showing a comparator results for a mode controller in accordance with various examples. In graph 400, various waveforms are represented including a $V_{TFF}$ waveform 410, $V_{TFFAVG}$ waveform 402, a $V_{CTRL}$ waveform 420, a $V_{RAMP}$ waveform 412, a $V_{SLOPE}$ waveform 422, and a $V_{S/H}$ waveform 430. Graph 400 also shows a reset waveform ($V_{RST}$) 414 and a feedback waveform ($V_{FB}$). Also, graph 400 shows a combination waveform 432 (a combination of $V_{CTRL}+V_{S/H}+V_{TFF}$), a combination waveform 434 (a combination of $V_{RAMP}+V_{SLOPE}+V_{TFFAVG}$), and a $V_{FB}$ waveform 436.

Figure 5:
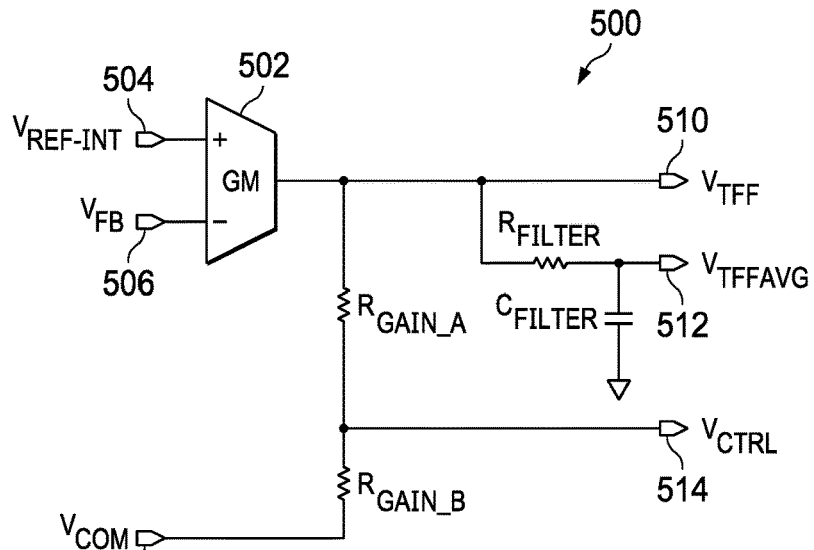
FIG. 5 is a schematic diagram showing gain and level shifter circuit in accordance with various examples.

FIG. 5 is a schematic diagram showing gain and level shifter circuit 500 in accordance with various examples. In some examples, the gain and level shifter circuit 500 of FIG. 5 represents components the gain and level shifter circuit 206 in FIG. 2. As shown, the gain and level shifter circuit 500 includes a gm (transconductance) stage 502 with $V_{REF}$-INT and $V_{FB}$ as inputs provided by respective nodes 504 and 506. The output of the gm stage 502 is coupled to an output node 510 to provide $V_{TFF}$. The gain and level shifter circuit 500 also includes various resistors ($R_{GAIN\_A}$, $R_{GAIN\_B}$, $R_{FILTER}$) to set the voltage levels for $V_{CTRL}$ and $V_{TFFAVG}$. More specifically, $R_{GAIN\_A}$ and $R_{GAIN\_B}$ are coupled in series between the output of the gm stage 502 and a $V_{COM}$ node 508. As shown, an output node 514 between $R_{GAIN\_A}$ and $R_{GAIN\_B}$ provides $V_{CTRL}$. Finally, an output node 512 provides $V_{TFFAVG}$, where $R_{FILTER}$ is between the output node 512 and the output of the gm stage 502. Also, a capacitor ($C_{FILTER}$) is coupled between the output node 512 and a ground node. In the example of FIG. 5, the gm for the gm stage 502 is achieved by a voltage across a fixed resistor ($R_{Gm}$), where gm is proportional to $1/R_{GM}$. The total gain for $V_{CTRL}$ and $V_{TFF}$ will be well controlled by the resistor ratio of $R_{GM}$, $R_{GAIN\_A}$, and $R_{GAIN\_B}$.

In some examples, the time constant of the filter to generate $V_{TFFAVG}$ is very large. In one example, the value for $R_{FILTER}$ is 2MΩ and the value for $C_{FILTER}$ is 5 pF. Without limitation to other examples, $V_{CTRL}$ and $V_{TFF}$ are given as:

$$V_{ctrl}=Gm \cdot R_{GAIN\_B}(V_{REF-INT}-V_{FB})+V_{COM}, \quad \text{Equation (1)}$$

$$V_{TFF}=Gm \cdot (R_{GAIN\_A}+R_{GAIN\_B})(V_{REF-INT}-V_{FB})+V_{COM} \quad \text{Equation (2)}$$

Figure 6:
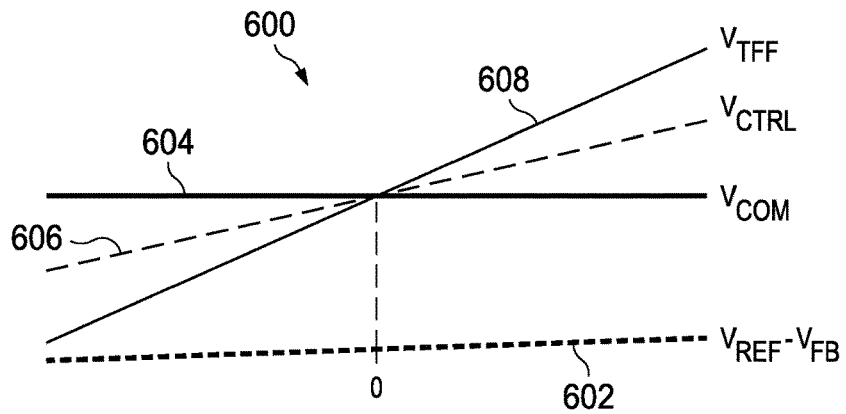
FIG. 6 is a graph showing waveforms related to a gain and level shifter scenario in accordance with various examples.

FIG. 6 is a graph 600 showing voltages related to a gain and level shifter scenario in accordance with various examples. In graph 600, a $V_{COM}$ waveform 604, a $V_{CTRL}$ waveform 606, and a $V_{TFF}$ waveform 608 relative to a $V_{REF}-V_{FB}$ waveform 602.

Figure 7:
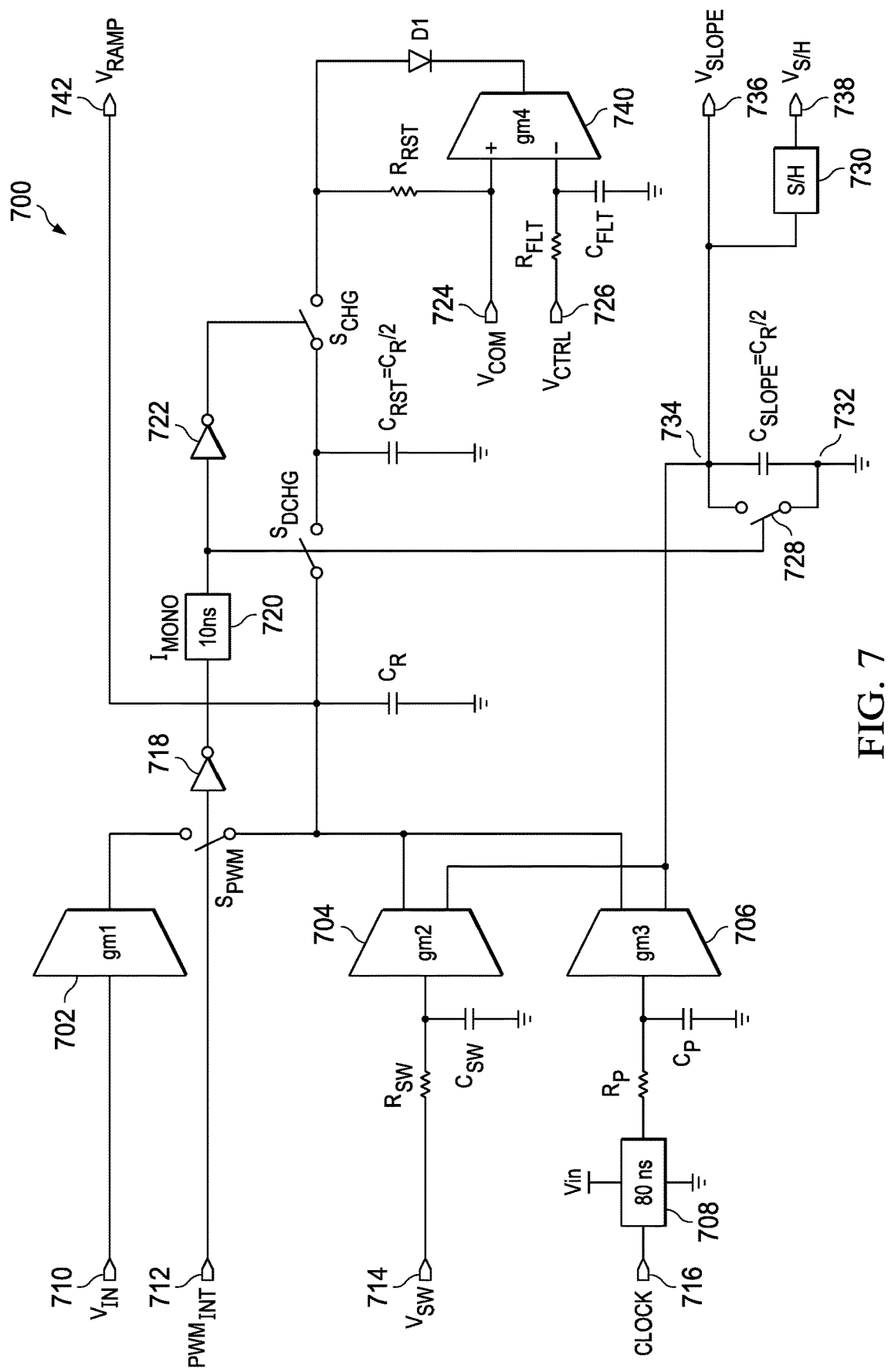
FIG. 7 is a schematic diagram showing ramp generation and slope compensation circuit in accordance with various examples.

FIG. 7 is a schematic diagram showing a ramp generation and slope compensation circuit 700 in accordance with various examples. The ramp generation and slope compensation circuit 700 of FIG. 7 is an example of the ramp generator circuit 216 and the slope compensation circuit 218 in FIG. 1. As shown, the ramp generation and slope compensation circuit 700 includes various gm stages 702, 704, and 706 are coupled to different input nodes. More specifically, the gm stage 702 is coupled to a Vin node 710 to receive Vin. The gm stage 704 is coupled to a node 714 via a resistor ($R_{SW}$), where a capacitor ($C_{SW}$) is between an input of the gm stage 704 and a ground node. Meanwhile, the gm stage 706 is coupled to a clock node 716 via a resistor ($R_P$), where a capacitor ($C_P$) is between an input of the gm stage 706 and a ground node. Also, a component 708 between the clock node 716 and $R_P$ generates a pulse such as an 80 ns pulse. The outputs of the gm stages 704 and 706 are combined. Also, the output of the gm stage 702 is selectively combined with the outputs of the gain stages 704 and 706 via a switch, $S_{PWM}$, controlled by $PWM_{INT}$.

In FIG. 7, the combined current from the gm stages 704 and 706 discharges a capacitor ($C_R$) while the current output of the gm stage 702 charges $C_R$ when $PWM_{INT}$ is high. The voltage on $C_R$ is provided to a switch ($S_{DCHG}$) and a $V_{RAMP}$ node 742. In the example of FIG. 2, the $PWM_{INT}$ signal is also input to an inverter 718, where the output of the inverter 718 is provides to a component 720 to provide a 10 ns pulse. The output of the component 720 is used to control $S_{DCHG}$ and another switch 728. The output of the component 720 is also provided to an inverter 722. The output of the inverter 722 directs another switch ($S_{CHG}$). Between $S_{DCHG}$ and $S_{CHG}$ is another capacitor ($C_{RST}$) coupled to a ground node, where $C_{RST}=C_R/2$.

In the example of FIG. 7, the ramp generation and slope compensation circuit 700 includes another gm stage 740 that receives $V_{COM}$ from a $V_{COM}$ node 724 as a first input. The output of the gm stage 740 is coupled to the cathode of a diode (D1), where the anode of D1 is coupled to $S_{CHG}$. As shown, a resistor ($R_{RST}$) is between the first input of the gain stage 740 and $S_{CHG}$. The gain stage 740 is has a second input coupled to a $V_{CTRL}$ node 726 via a resistor ($R_{FLT}$). Also, a capacitor ($C_{FLT}$) is between the second input of the gain stage 740 and a ground node.

In the example of FIG. 7, the combination of the gm stages 704 and 706 is also provided to a $V_{SLOPE}$ node 736 to provide $V_{SLOPE}$. As shown, a capacitor ($C_{SLOPE}$) is coupled between a ground node and a node 734 at the outputs of the gm stages 704 and 706, where the output current of the gm stages 704 and 706 charge $C_{SLOPE}$ to generate $V_{SLOPE}$. In some examples, $C_{SLOPE}=C_R/2$. As shown, the switch 728 and $C_{SLOPE}$ are coupled in parallel between the node 734 and a ground node 732. Also, coupled to the node 734 is a sampling and hold (S/H) component 730, where the output of the S/H component 730 is coupled to a $V_{S/H}$ node 738.

In the example of FIG. 7, the first gm stage (gm1) 702 changes Vin to a charging current for $V_{RAMP}$. The second gm stage (gm2) 704, changes $V_{OUT}$ to a discharging current. The third gm stage (gm3) 706 changes the difference between $PWM_{INT}$ and external $PWM_{EXT}$ to a discharging current. Also, the fourth gm stage (gm4) 740 holds the peak of $V_{RAMP}$ and $V_{CTRL}$ close to $V_{COM}$. In some examples, to create a hysteresis between PSM, DCM and CCM, $gm_2=gm_3=0.75*gm_1$.

In the example of FIG. 7, Vin information is transferred to current by the first gm stage 702. The voltage at the SW node 714 is averaged by an RC filter formed by $R_{SW}$ and $C_{SW}$ to obtain Vout information. Then the second gm stage 704 changes the Vout information to current. As shown, the ramp generation and slope compensation circuit 700 receives $PWM_{INT}$ as a timing signal. In some examples, the rising edge of $PWM_{INT}$ is about 100 ns ahead of the real PWM signal ($PWM_{EXT}$) which is sent to the driver (e.g., driver 224 in FIG. 2). The 100 ns pulse is level shifted up to Vin and is filtered by the RC filter ($R_{SW}$ and $C_{SW}$) to generate a voltage related to the 100 ns. Then the third gm stage 706 changes this voltage to current. The $PWM_{INT}$ signal is used to control the timing of the gm stages 702, 704, and 706 to generate the ramp signal $V_{RAMP}$. When $PWM_{INT}$ is high, the first gm stage 702 charges $C_{RAMP}$ through $S_{PWM}$. Also, $S_{DCHG}$, $S_{CHG}$, $R_{RST}$, $C_{RST}$, and the fourth gm stage 740 are used to force the average of $V_{CTRL}$ to be close to $V_{COM}$. So that at the boundary of CCM, DCM and PSM, the control voltage position is always known.

At the falling edge of $PWM_{INT}$, the delay component ($I_{MONO}$) 720 generates a 10 ns pulse to turn on the $S_{DCHG}$, resulting in $C_R$ and $C_{RST}$ being connected. On the rest of the switching cycle, $S_{CHG}$ is on and the $C_{RST}$ is charged to a voltage equal to $R_{RST}*gm4*(V_{COM}-V_{CTRL})$. In some examples, the gm gain stage 740 can only sink current to allow ramp peak correction in CCM (shown as a D1 at the output of the fourth gm stage 740). In PSM, since $V_{CTRL}$ is normally lower than $V_{COM}$, there is no ramp peak correction. With $gm_2=gm_3=0.75*gm_1$, the pulse width in PSM is guaranteed to be about 75% of the pulse in CCM. In some examples, slope compensation operations generate a saw tooth waveform which has a slope equals to the down slope of $V_{RAMP}$. The charging currents come out of gm2 and gm3, and the value of $C_{SLOPE}$ ensures these two slopes are tracking. The sample/hold circuit 730 senses the peak voltage of $V_{SLOPE}$, which is forwarded to a loop comparator (e.g., the loop comparator 220 in FIG. 2).

Figure 8:
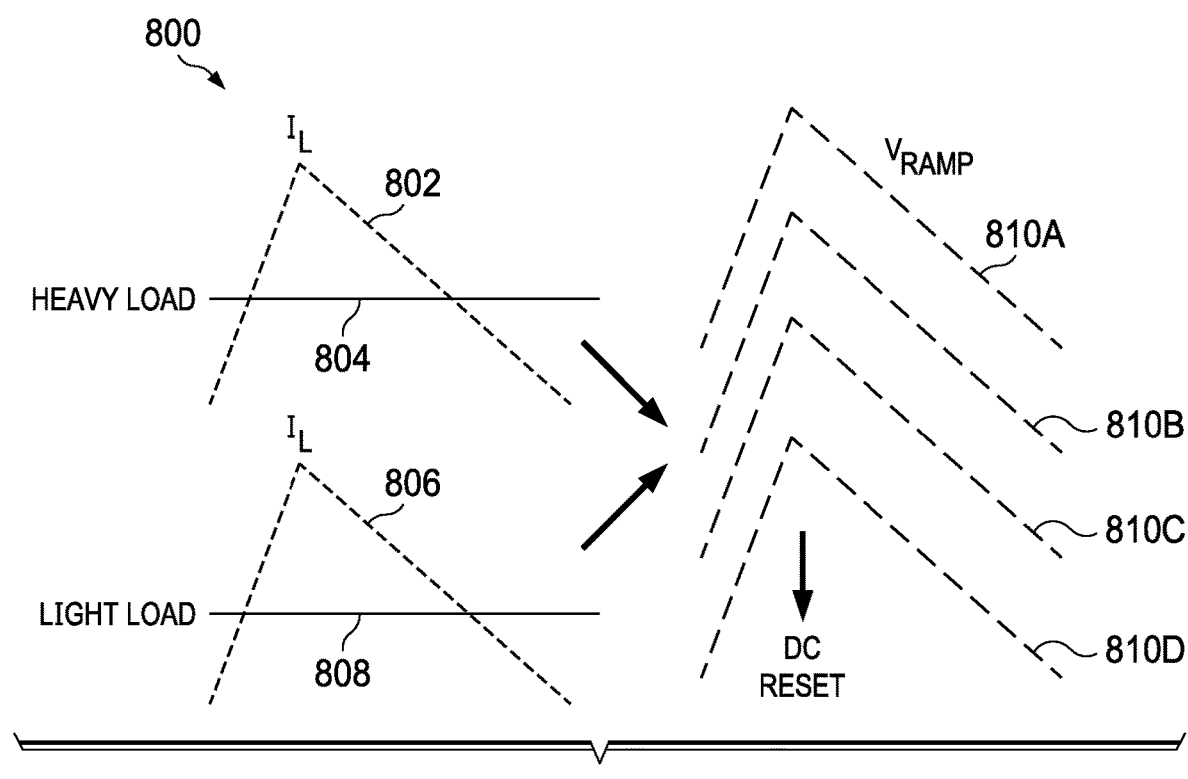
FIG. 8 is a graph showing correction of a volt-second imbalance or amp-sec imbalance in accordance with various examples.

FIG. 8 is a graph 800 showing correction of a volt-second imbalance or amp-second imbalance in accordance with various examples. In graph 800, a first load current ($I_L$) 802 is represented relative to a heavy load threshold 804. Also, a second $I_L$ 806 is represented relative to a light load threshold 808, where the first $I_L$ 802 and second $I_L$ 806 result in various $V_{RAMP}$ signals 810A-810D. On the left side of FIG. 8, inductor current ($I_L$) is represented as changing with load current. When the load current is heavy, $I_L$ will move up, and when the load current is light, $I_L$ will move down. $V_{RAMP}$ is different from $I_L$. In steady state, the average value of $V_{RAMP}$ cannot stay up and down like $I_L$ and can only sit on a fixed DC value. But during transient (when the $I_L$ is changing up and down), $V_{RAMP}$ will go up or down with $I_L$ for a while and then a DC RESET signal will pull $V_{RAMP}$ back to the DC value slowly. The volt-second imbalance that controls the inductor is mirrored by the current-second imbalance that controls the emulated ramp.

Figure 9:
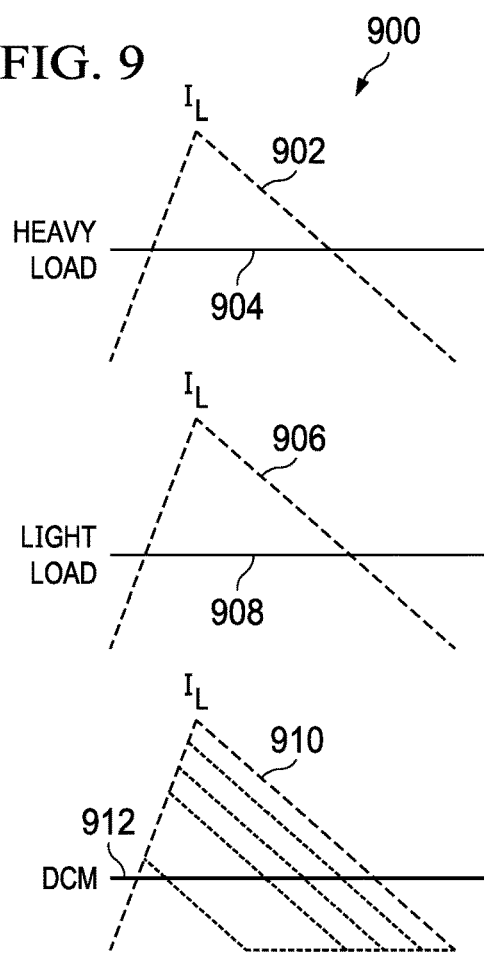
FIG. 9 is a graph showing a disconnect between a ramp voltage and an output current in accordance with various examples.

FIG. 9 is a graph 900 showing a disconnect between a ramp voltage and an output current in accordance with various examples. In graph 900, a first load current ($I_L$) 902 is represented relative to a heavy load threshold 904. Also, a second $I_L$ 906 is represented relative to a light load threshold 908. Also, a third $I_L$ 910 is represented relative to a DCM threshold 912. As represented in graph 900, once DCM is reached there is a disconnect between $V_{RAMP}$ and $I_L$.

Figure 10:
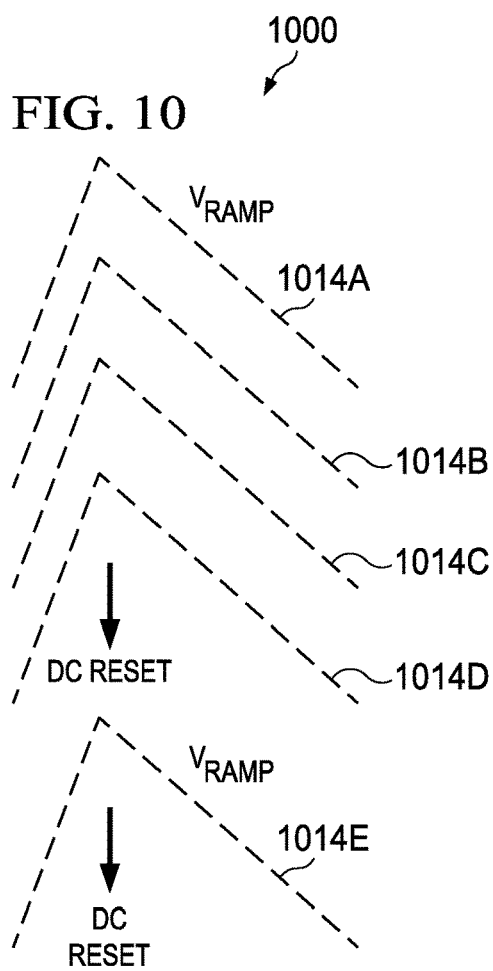
FIG. 10 is a graph showing ramp voltage as a function of DC reset signals in accordance with various examples.

FIG. 10 is a graph 1000 showing $V_{RAMP}$ waveforms 1014A-1014E as a function of DC resets in accordance with various examples. In graph 1000, various $V_{RAMP}$ waveforms 1014A-1014E are represented. $V_{RAMP}$ can only stay around the DC voltage in steady state. As represented in graph 900 of FIG. 9, During load transient, $I_L$ and $V_{RAMP}$ go up. After transient, $V_{RAMP}$ will be slowly pulled back to the DC value using DC resets as represented in graph 1000 of FIG. 10. In some examples, the volt-second imbalance that controls the inductor is mirrored by the current-second imbalance that controls the emulated ramp.

Figure 11:
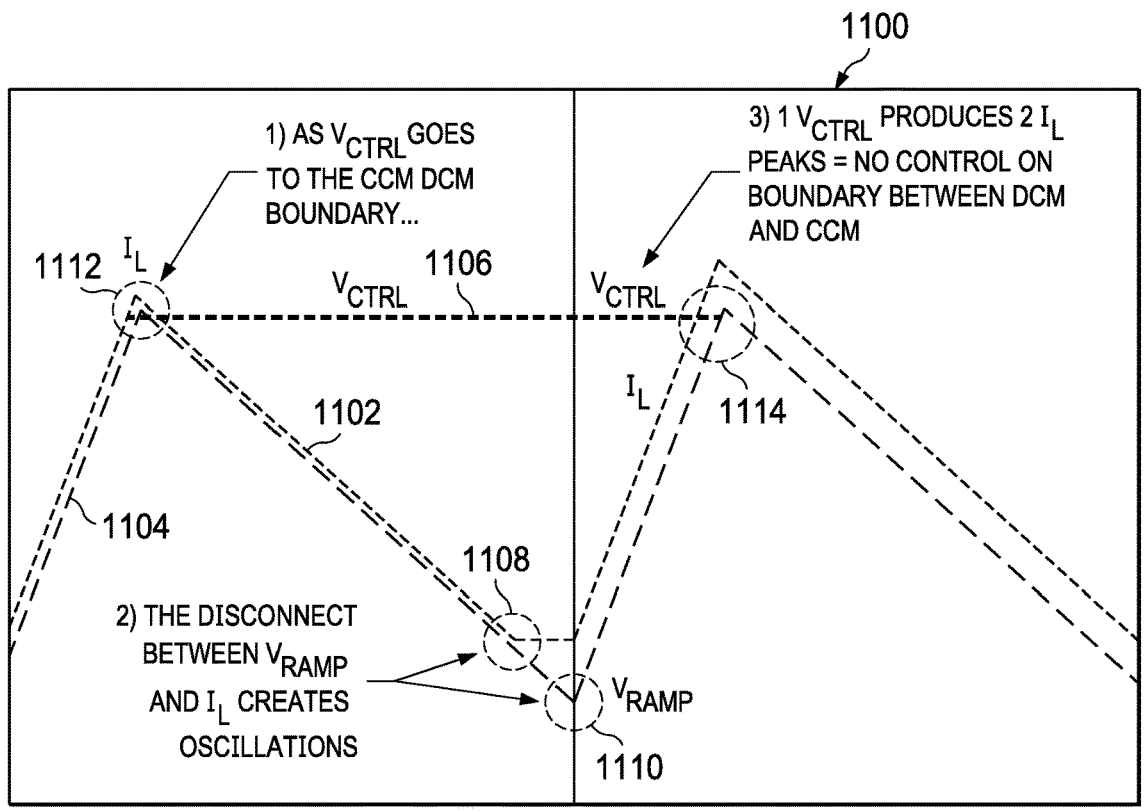
FIG. 11 is a graph showing mode controller waveforms in accordance with various examples.

FIG. 11 is a graph 1100 showing mode controller waveforms in accordance with various examples. More specifically, the graph 1100 shows control voltage ($V_{CTRL}$) 1106 relative to a ramp voltage ($V_{RAMP}$) 1104 and a load current ($I_L$) 1102 in accordance with various examples. In the graph 1100, various areas of interest 1108, 1110, 1112, and 1114 are represented. More specifically, the area of interest 1108 represents $V_{CTRL}$ 1106 reaching the CCM DCM boundary. In response, the disconnect between $V_{RAMP}$ 1104 and $I_L$ 1102 causes oscillations as represented by areas of interest 1108 and 1110. Accordingly, $V_{CTRL}$ produces two $I_L$ peaks (no control on boundary between DCM and CCM) as represented by area of interest 1114. Accordingly, as represented in graph 1100, there is no correlation between $V_{RAMP}$ and $I_L$ in DCM.

Figure 12:
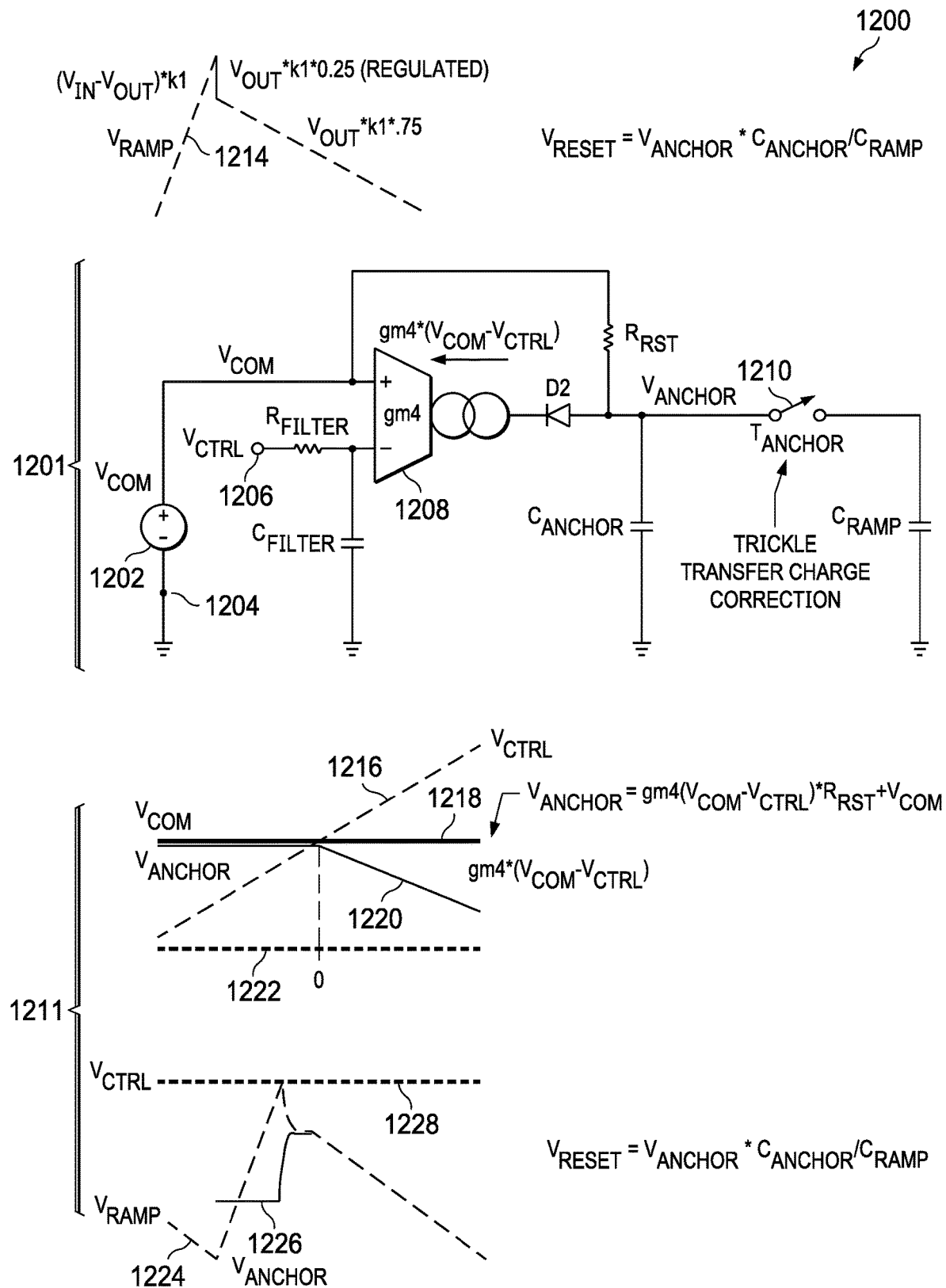
FIG. 12 is a schematic diagram and graph showing a mode controller scenario in accordance with various examples.

FIG. 12 is a schematic diagram and graph showing a mode controller scenario 1200 in accordance with various examples. In the mode controller scenario 1200, the circuit 1201 is an example of the ramp generator and slope compensation circuit 700 of FIG. 7, where the circuit 1201 performs trickle transfer charge correction to smooth transitions between CCM and DMC.

In the mode controller scenario 1200, a $V_{RAMP}$ signal 1214 is represented, where the rising slope for the $V_{RAMP}$ signal 1214 is given as $(V_{IN}-V_{OUT})*K1$ and the falling slope is given as $(V_{OUT})*K1*0.75$. In the mode controller scenario 1200, the falling slope is reduced due to a voltage drop $(V_{OUT})*K1*0.25$.

Also represented in the mode controller scenario 1200 is a circuit 1201 with a gm stage 1208 that amplifies the error between $V_{COM}$ (provided by a voltage source 1202 between one input of the gm stage 1208 and a ground node 1204) and an input signal obtained by passing $V_{CTRL}$ through an RC filter formed by $R_{FILTER}$ and $C_{FILTER}$. The output of the gm stage 1208 is coupled to the anode of a diode (D2). The cathode of D2 is coupled to a feedback path for the gm stage 1208, where the feedback path includes a resistor ($R_{RST}$). The cathode of D2 is also coupled to the top plate of $C_{ANCHOR}$ and to a switch 1210 controlled by $T_{ANCHOR}$, where $C_{ANCHOR}$ stores $V_{ANCHOR}$. The switch 1210 is also coupled to the top plate of $C_{RAMP}$. With the circuit 1201, trickle transfer charge correction is performed using switch 1210.

The mode controller scenario 1200 also shows a graph 1211 with various represented signals (a $V_{CTRL}$ signal 1216, a $V_{COM}$ signal 1218, a $V_{ANCHOR}$ signal 1220) relative to a threshold 1222. The graph 1211 also shows a $V_{RAMP}$ signal 1224 and a $V_{ANCHOR}$ signal 1226 relative to a $V_{CTRL}$ signal 1228. For graph 1211, $V_{ANCHOR}$=gm4($V_{COM}-V_{CTRL}$) *$R_{RST}$+$V_{COM}$ and $V_{RST}$=$V_{ANCHOR}$*$C_{ANCHOR}$/$C_{RAMP}$.

In the mode controller scenario 1200, the slope of $V_{OUT}$ is reduced to allow DCM to CCM transitions. In some examples, the falling slope of $V_{OUT}$ is reduced by 75%. The circuit 1201 is a control loop to produce a $V_{DELTA}$ step on $V_{RAMP}$ to cover the missing 25%. In the mode controller scenario 1200, D2 is the same as D1 in FIG. 7, and is used to cause gm4 to only sink current. That means gm4 will not work in DCM (when gm4 needs to source current).

Figure 13:
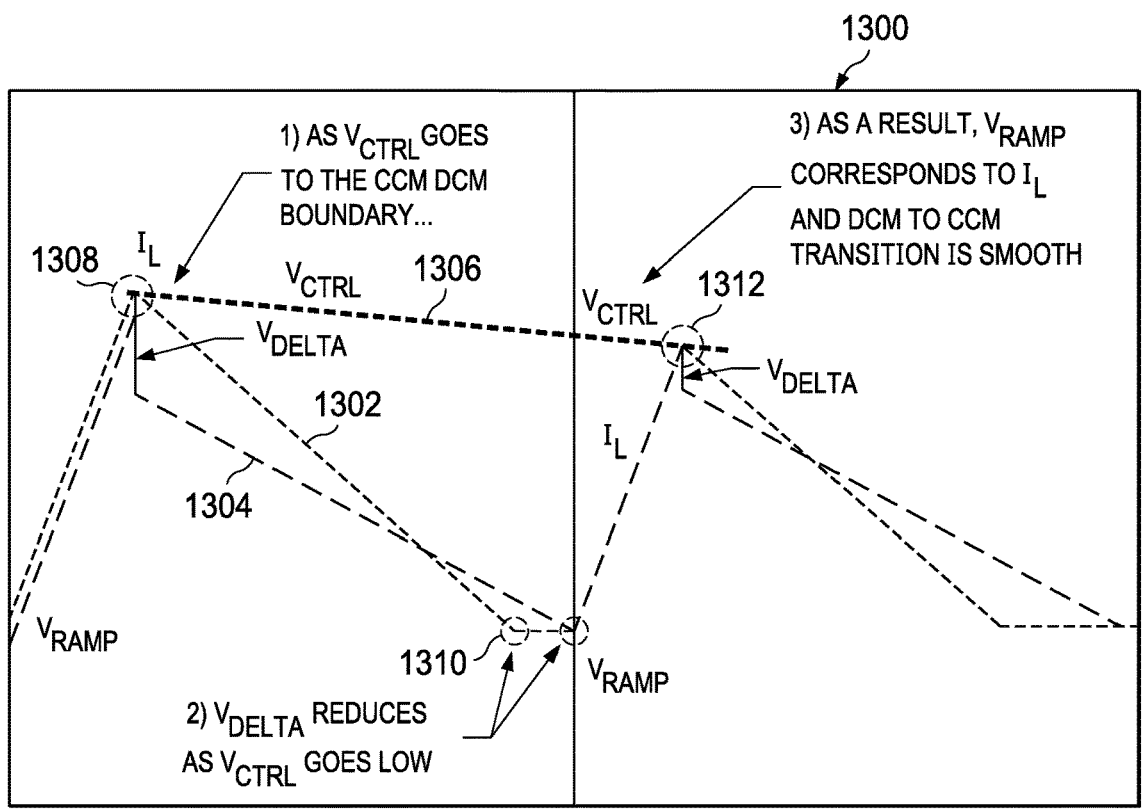
FIG. 13 is a graph showing waveforms related to the mode controller scenario of FIG. 12 in accordance with various examples.

FIG. 13 is a graph 1300 showing waveforms related to the mode controller scenario 1200 of FIG. 12 in accordance with various examples. In graph 1300, an $I_L$ waveform 1302, a $V_{RAMP}$ waveform 1304, and a $V_{CTRL}$ waveform 1306 is represented. Also, $V_{DELTA}$ steps are represented, which reduce the falling slope of the $V_{RAMP}$ waveform 1304.

In the graph 1300, various areas of interest 1308, 1310, and 1312 are represented. More specifically, the area of interest 1308 represents $V_{CTRL}$ 1306 reaching the CCM DCM boundary. The area of interest 1310 represents a reduction in $V_{DELTA}$ as $V_{CTRL}$ 1306 goes low. As a result, at the area of interest 1312, $V_{RAMP}$ 1304 corresponds to $I_L$ 1302 and the DCM CCM transition is smooth.

Figure 14:
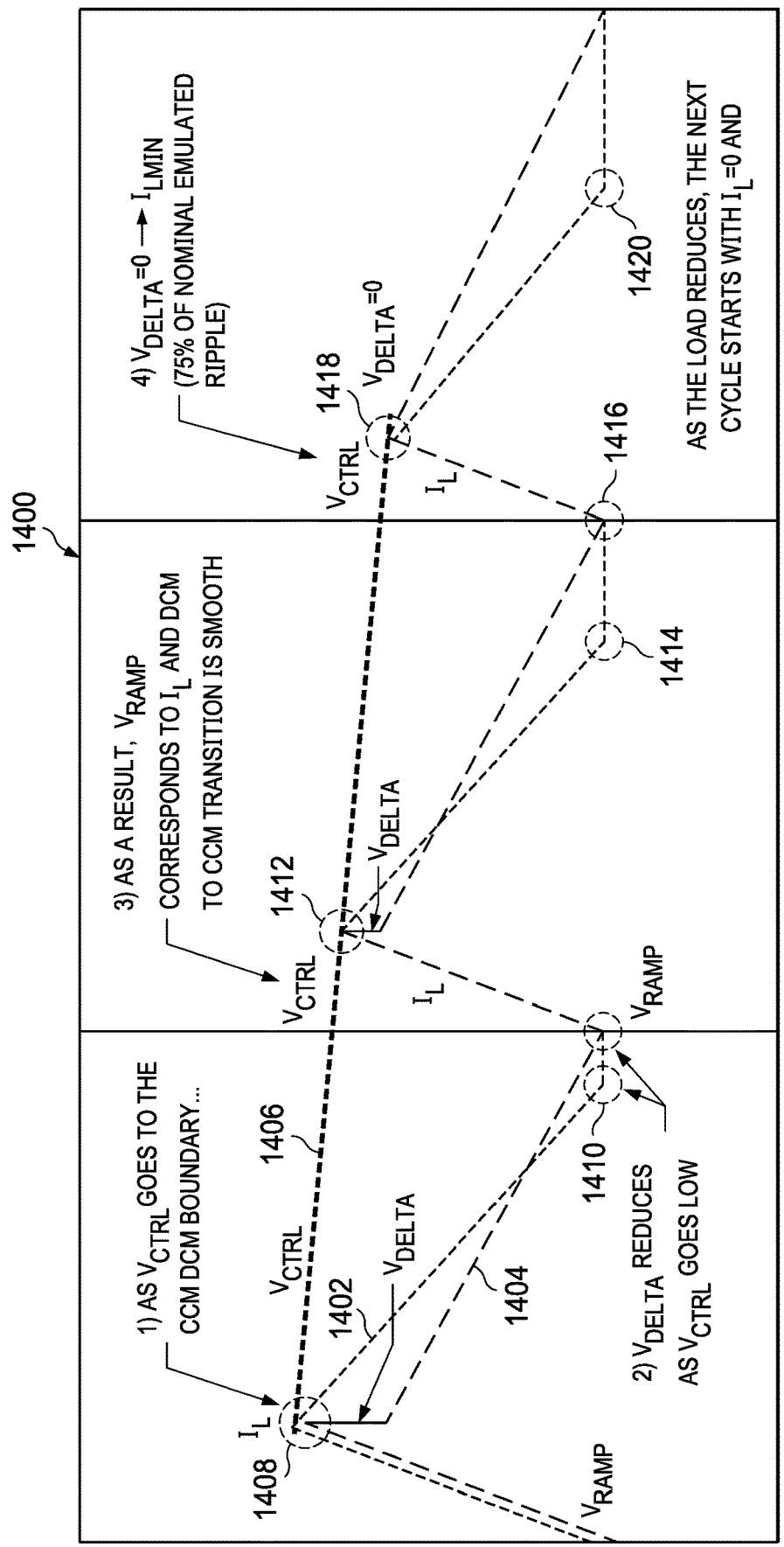
FIG. 14 is another graph showing waveforms related to a mode controller scenario in accordance with various examples.

FIG. 14 is another graph 1400 showing signals related to a mode controller scenario in accordance with various examples. In graph 1400, an $I_L$ waveform 1402, a $V_{RAMP}$ waveform 1404, and a $V_{CTRL}$ waveform 1406 is represented. Also, $V_{DELTA}$ steps are represented, which reduce the falling slope of the $V_{RAMP}$ waveform 1404.

In the graph 1400, various areas of interest 1408, 1410, and 1412, 1414, 1416, 1418, and 1420 are represented. More specifically, the area of interest 1408 represents $V_{CTRL}$ 1406 reaching the CCM DCM boundary. The area of interest 1410 represents a reduction in $V_{DELTA}$ as $V_{CTRL}$ 1406 goes low. As a result, at the area of interest 1412, $V_{RAMP}$ 1404 corresponds to $I_L$ 1402 and the DCM CCM transition is smooth. The areas of interest 1414, 1416, and 1420 represent a reduced load scenario, where the next cycle starts with $I_L$=0. At the area of interest 1418, $V_{DELTA}$=0 and $I_L$ is at a minimum peak (e.g., 75% of nominal peak current).

Figure 15:
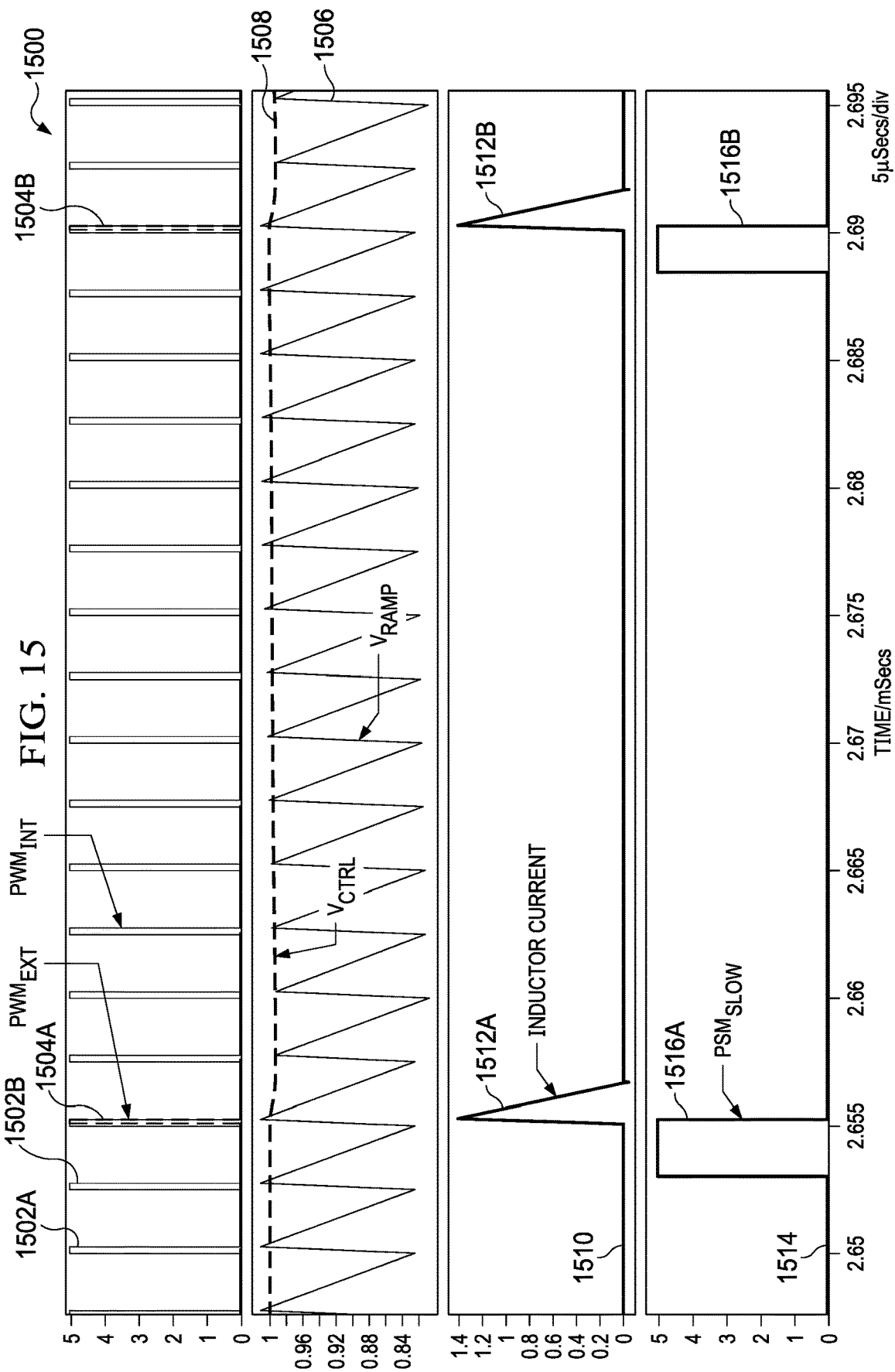
FIG. 15 is a graph showing waveforms related to a mode controller scenario in accordance with various examples.

FIG. 15 is a graph 1500 showing waveforms related to a mode controller scenario in accordance with various examples. In graph 1500, PWM$_{INT}$ pulses (e.g., PWM$_{INT}$ pulses 1502A and 1502B) and PWM$_{EXT}$ pulses (e.g., PWM$_{INT}$ pulses 1504A and 1504A) are represented. Also, a V$_{RAMP}$ waveform 1506 and a V$_{CTRL}$ waveform 1508 are represented. Also, an inductor current 1510 and related pulses 1512A and 1512B are represented. Also, a PSM$_{SLOW}$ waveform 1514 and related pulses 1516A and 1516B are represented.

Figure 16:
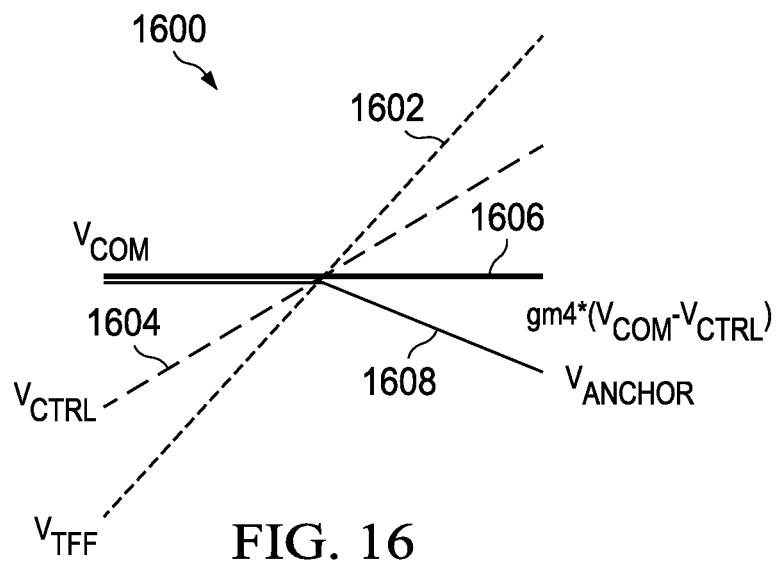
FIG. 16 is a graph showing voltage slopes related to a mode controller scenario in accordance with various examples.

FIG. 16 is a graph 1600 showing voltage slopes related to a mode controller scenario in accordance with various examples. In the graph 1600, a V$_{TFF}$ signal 1602, a V$_{CTRL}$ signal 1604, a V$_{COM}$ signal 1606, and a V$_{ANCHOR}$ signal 1608 are represented. Also, the graph 1600 notes the relationship gm4(V$_{COM}$-V$_{CTRL}$). In FIG. 16, gm4(V$_{COM}$-V$_{CTRL}$) is the output current of gm4. With the diode D2 in FIG. 12 (or D1 in FIG. 7), this current can only go one direction. Accordingly, V$_{ANCHOR}$ will be gm4(V$_{COM}$-V$_{CTRL}$)*R$_{RST}$+V$_{COM}$. In graph 1600, because of D2, V$_{ANCHOR}$ can only go below V$_{COM}$.

Figure 17:
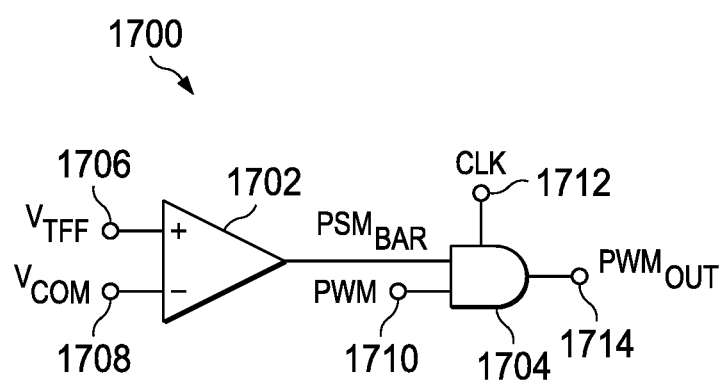
FIG. 17 is a schematic diagram showing a mode controller circuit in accordance with various examples.

FIG. 17 is a schematic diagram showing a mode controller circuit 1700 in accordance with various examples. In some examples, the mode controller circuit 1700 is part of the PWM circuit 222 in FIG. 2. As shown, the mode controller circuit 1700 includes a comparator 1702 that receives V$_{TFF}$ from node 1706 and V$_{COM}$ from 1708. The output of the comparator 1702 is PSM$_{BAR}$ (e.g., PSM$_{SLOW}$). The mode controller circuit 1700 also includes an AND gate 1704 configured to receive PSM$_{BAR}$ and a PWM signal from node 1710. As shown, the AND gate 1704 receives a clock signal (CLK) from node 1712. The output of the AND gate 1704 is PWM$_{OUT}$, which is provided to node 1714. With the mode controller circuit 1700, once V$_{TFF}$ goes under V$_{COM}$, PSM$_{BAR}$ will be low, resulting in PSM$_{OUT}$ skipping PWM pulses.

Figure 18:
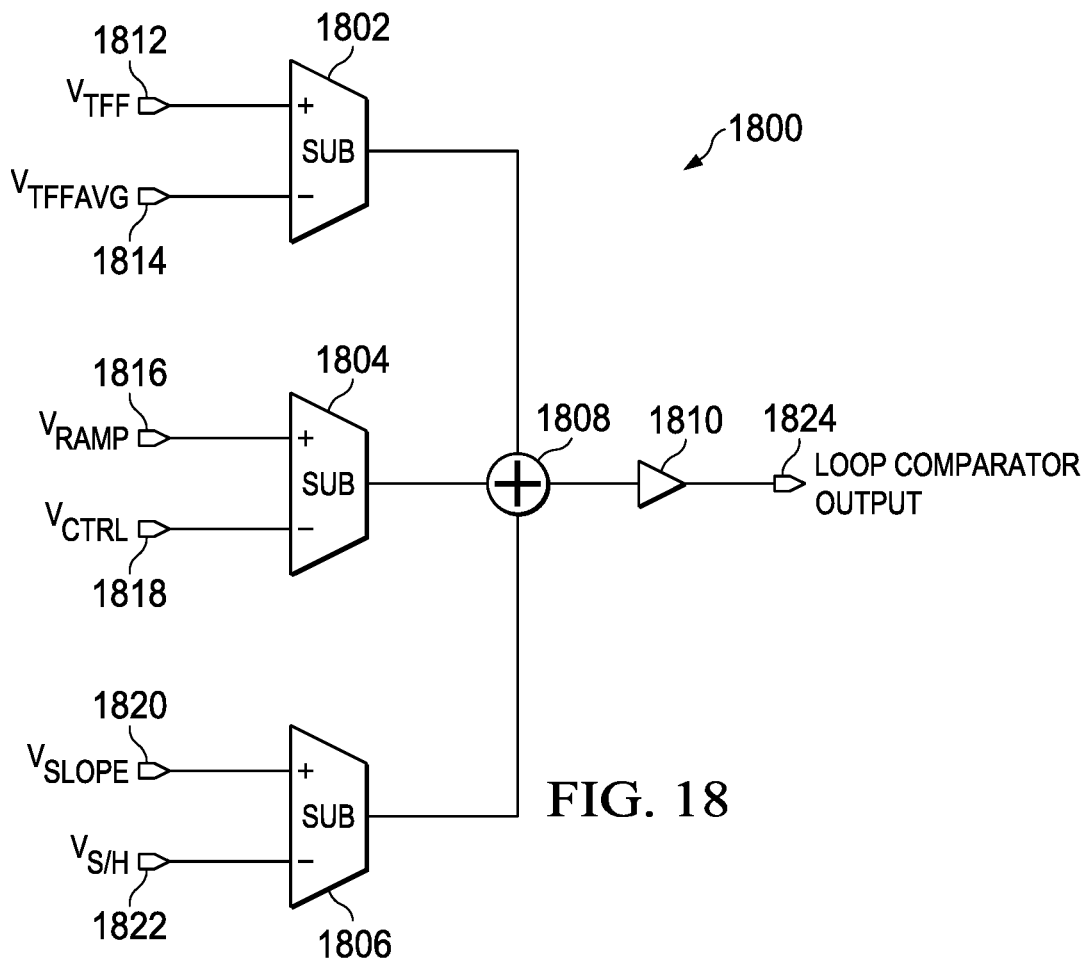
FIG. 18 is a schematic diagram showing a loop comparator circuit in accordance with various examples.

FIG. 18 is a schematic diagram showing loop comparator circuit 1800 in accordance with various examples. In some examples, the loop comparator circuit 1800 is part of the loop comparator 220 in FIG. 2. As shown, the loop comparator circuit 1800 includes comparators 1802, 1804, and 1806. More specifically, the comparator 1802 receives V$_{TFF}$ from node 1812 and receives V$_{TFFAVG}$ from node 1814. Also, the comparator 1804 receives V$_{RAMP}$ from node 1816 and receives V$_{CTRL}$ from node 1818. Also, the comparator 1806 receives V$_{SLOPE}$ from node 1820 and receives V$_{S/H}$ from node 1822. The outputs of the comparators 1802, 1804, and 1806 are summed at summing block 1808, where the summed outputs are buffered by buffer 1810 and are provided as a loop comparator output at node 1824.

With the loop comparator circuit 1800, the sum of the positive inputs (V$_{TFF}$+V$_{RAMP}$+V$_{SLOPE}$) will be compared with the sum of the negative inputs (V$_{CTRL}$+V$_{TFFAVG}$+V$_{S/H}$). When the sum of the positive inputs is greater than the sum of the negative inputs, the output of the loop comparator circuit 1800 will be high, resulting in PWM$_{INT}$ and PWM$_{EXT}$ being terminated.

Figure 19:
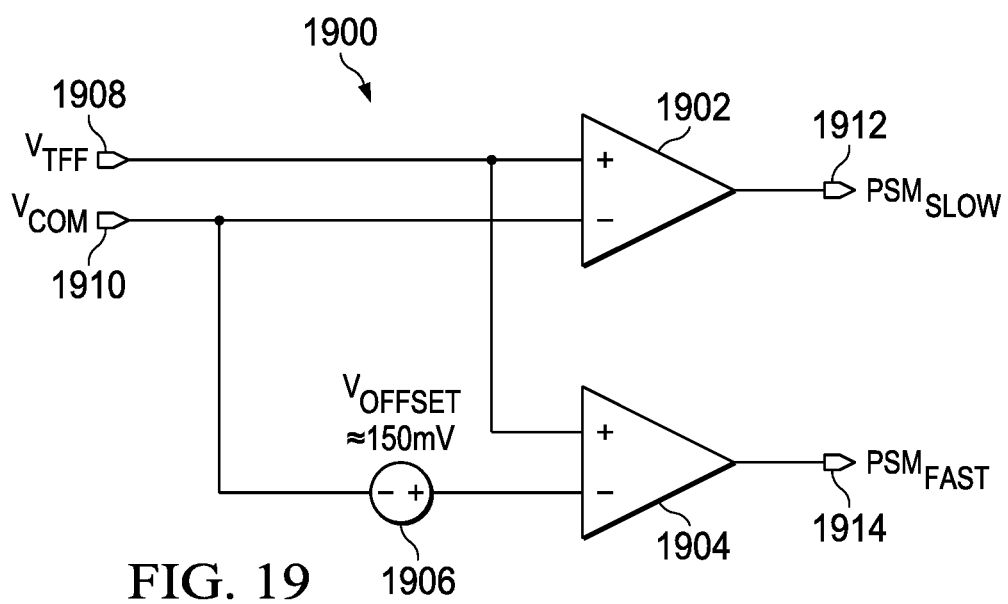
FIG. 19 is a schematic diagram showing a pulse-skipping mode (PSM) comparator circuit in accordance with various examples.

FIG. 19 is a schematic diagram showing a PSM comparator circuit 1900 in accordance with various examples. In some examples, the PSM comparator circuit 1900 corresponds the PSM comparator circuit 210 in FIG. 2. As shown, the PSM comparator circuit 210 comprises a first comparator 1902 and a second comparator 1904. The first comparator 1902 receives V$_{TFF}$ (from node 1908) and V$_{COM}$ (from node 1910) as inputs. Meanwhile, the second comparator 1904 receives V$_{TFF}$ (from node 1908) and V$_{COM}$+V$_{OFFSET}$ as inputs. In the PSM comparator circuit 1900, V$_{OFFSET}$ is provided by an offset component 1906 between node 1910 and the second comparator 1904. As shown in FIG. 19, the output of the first comparator 1902 is PSM$_{SLOW}$, which is output to node 1912. Meanwhile, the output of the second comparator 1904 is PSM$_{FAST}$, which is output to node 1914. With the PSM comparator circuit 1900, the first comparator 1902 compares the V$_{TFF}$ and V$_{COM}$ directly to decide whether PWM$_{INT}$ in next clock cycle should be skipped or not. The second comparator 1904 compares the V$_{TFF}$ and V$_{COM}$+V$_{OFFSET}$ to let the present cycle PWM$_{INT}$ be sent out to PWM$_{EXT}$ when the load transient is sufficiently large to pull V$_{OUT}$ below a threshold. In this manner, the control loop will respond to the transient immediately rather than wait for next clock cycle.

Figure 20:
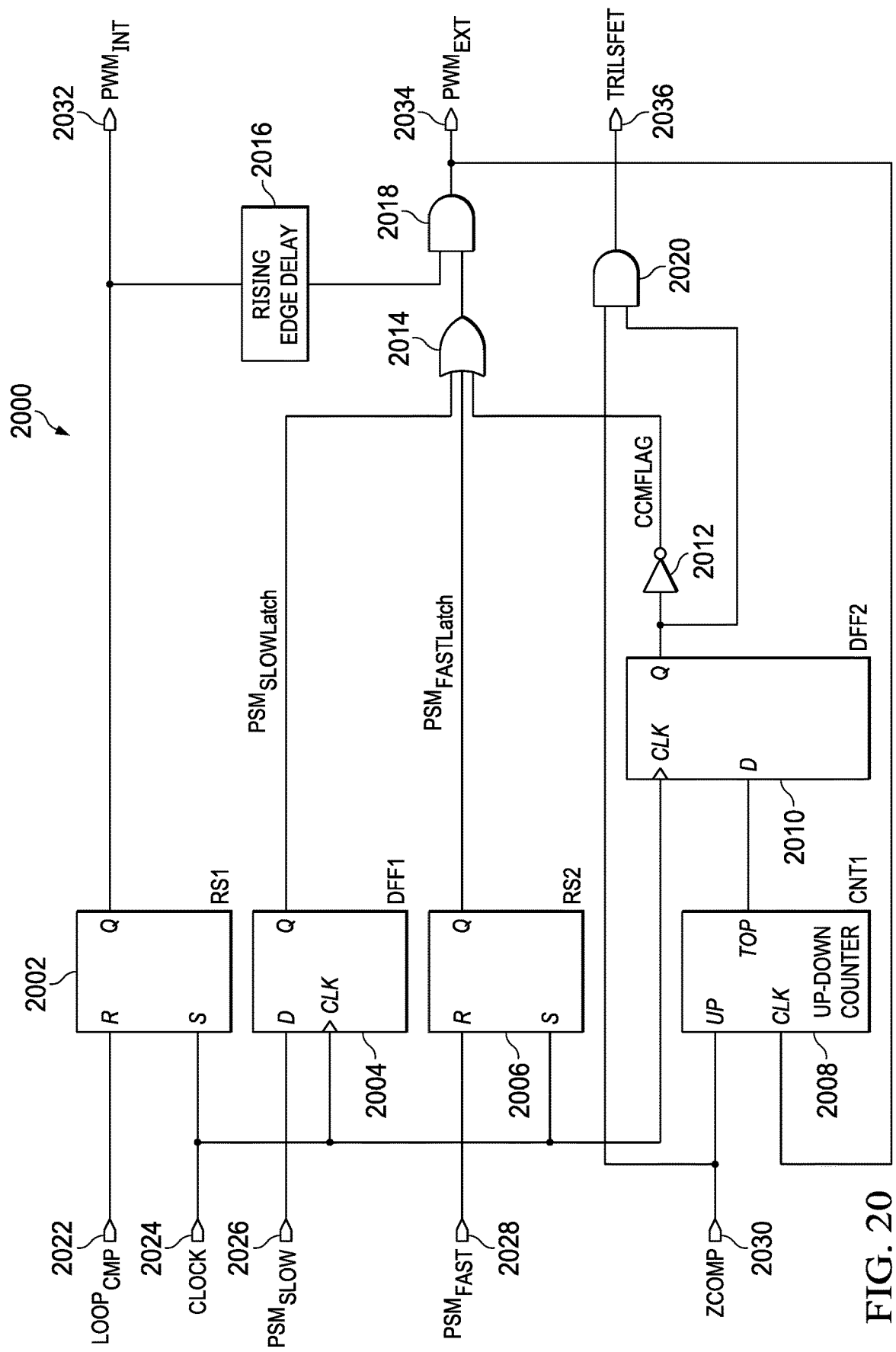
FIG. 20 is a schematic diagram showing a pulse-width modulation (PWM) circuit in accordance with various examples.

FIG. 20 is a schematic diagram showing a PWM circuit 2000 in accordance with various examples. In some examples, the PWM circuit 2000 of FIG. 20 is an example of the PWM circuit 222 in FIG. 2. As shown, the PWM circuit 2000 includes an RS flip flop 2002 configured to forward a LOOP$_{CMP}$ signal (the output from a loop comparator such as the loop comparator 220) received from LOOP$_{CMP}$ node 2022 as PWM$_{INT}$, where the RS flip flop 2002 is clocked by a fixed frequency clock signal received from clock node 2024. As described herein, PWM$_{INT}$ is an internal PWM signal to control the internal ramp generator. In the example of FIG. 20, PWM$_{INT}$ is generated from a clock signal and the loop comparator output LOOP$_{CMP}$. More specifically, on the rising edge of the clock signal provided by the clock node 2024, the RS flip-flop 2002 will be set to 1. The RS flip-flop 2002 will be reset when LOOP$_{CMP}$ goes high. This RS1 generates the PWM signal on PWM$_{INT}$. This PWM$_{INT}$ is used to control the internal RAMP signal in every clock cycle regardless of which mode (CCM, DCM or PSM) is in use. Accordingly, PWM$_{INT}$ is issued in every clock cycle.

The PWM circuit 2000 also includes a D flip flop 2004 configured to forward a PSM$_{SLOW}$ signal received from PSM$_{SLOW}$ node 2026 as PSM$_{SLOWLATCH}$, where the RS flip flop 2002 is clocked by the clock signal received from clock node 2024. The PWM circuit 2000 also includes another RS flip flop 2006 configured to forward a PSM$_{FAST}$ signal received from PSM$_{FAST}$ node 2028 as PSM$_{FASTLATCH}$, where the RS flip flop 2006 is clocked by the clock signal received from clock node 2024. The PWM circuit 2000 also includes another D flip flop 2010 configured to forward a counter signal from up-down counter 2008, where the up-down counter 2008 receives Z$_{COMP}$ (the output of an inductor current zero current comparator) from Z$_{COMP}$ node 2030, and wherein the counter 2008 is clocked by PWM$_{EXT}$ (the external PWM signal to control the driver and power stage) available at PWM$_{EXT}$ node 2034. The signal output from the up-down counter 2008 is provided to D flip flop 2010, where the D flip flop 2010 is clocked by the clock signal received from clock node 2024. The output of the D flip flop 2010 is provided to an inverter 2012 and to an AND gate 2020. The output of the inverter 2012 is labeled CCMFLAG.

As shown in FIG. 20, the PWM circuit 2000 also includes an OR gate 2014 receives CCMFLAG, PSM$_{SLOWLATCH}$, and PSM$_{FASTLATCH}$. The output of the OR gate 2014 is provided to an AND gate 2018 along with the output of a rising edge delay block 2016 coupled to PWM$_{INT}$ node 2032. The output of the AND gate 2018 is coupled to the PWM$_{EXT}$ node 2034. The PWM circuit 2000 also includes an AND gate 2020 coupled to the Z$_{COMP}$ node 2030 and to the output of the D flip flop 2010. The output of the AND gate 2020 is coupled to a TRILSFET node 2036 to provide a low side FET off signal.

With the PWM circuit 2000, $PWM_{EXT}$ is generated from $PWM_{INT}$ and PSM control signals. More specifically, at every rising edge of the $PWM_{INT}$, the zero current comparator output $Z_{COMP}$ is counted. If $Z_{COMP}$ is zero, the up-down counter 2008 will count down or stay unchanged. If the $Z_{COMP}$ is high, the up-down counter 2008 will count up until it reaches a threshold value. At the threshold counter number, the TOP signal will go high. This TOP signal is latched by the D flip flop 2010 and will be the CCM flag signal.

When CCMFLAG is high, the related converter is working in CCM mode. The $PWM_{INT}$ signal is directly passed to $PWM_{EXT}$ after delaying the rising edge by a fixed value (e.g., 100 ns). This delay is added to handle loop delay in order to support high frequency operation. After counting preset number of zero cross events, the TOP will go high and CCMFLAG will go low. At this point, the converter is working in DCM or PSM. In these modes, the power stage will be tristate when there is a zero cross event. If the load current drops lower, $PSM_{SLOW}$ and $PSM_{FAST}$ will be low. When $PSM_{SLOW}$ and $PSM_{FAST}$ are low, $PWM_{EXT}$ will be blocked and the converter will be in PSM. When there is no big load step up transient, $PSM_{FAST}$ will not be triggered. Accordingly, a full DCM pulse width will be issued in next cycle to guarantee consistent DCM/PSM pulse width. When there is a big load step up transient, $PSM_{FAST}$ will be trigger, and pass the $PWM_{INT}$ of present cycle to $PWM_{EXT}$ to guarantee the fast load transient response.

Figure 21:
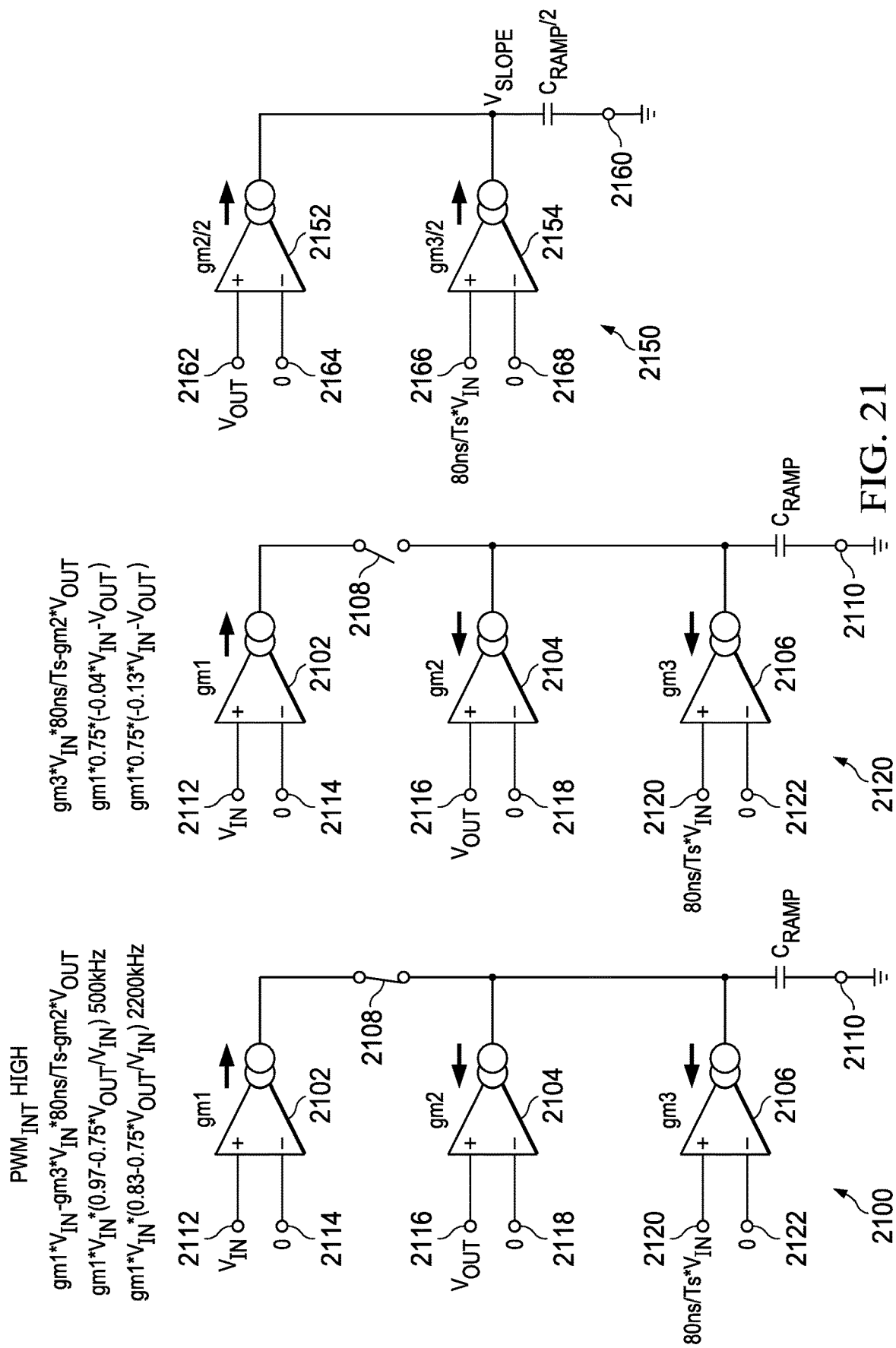
FIG. 21 is a schematic diagram showing mode controller scenarios in accordance with various examples.

FIG. 21 is a schematic diagram showing mode controller scenarios 2100, 2120, and 2150 in accordance with various examples. More specifically, the mode controller scenarios 2100 and 2120 represent the function of a ramp generator circuit such as the ramp generator circuit 216 in FIG. 2. Meanwhile, the mode controller scenario 2150 represents the function of a slope compensation circuit such as the slope compensation circuit 218 in FIG. 2.

In the mode controller scenario 2100, $PWM_{INT}$ is high. In such case, $V_{RAMP}$ is a function of a first gm stage (gm1) 2102, a second gm stage (gm2) 2104, and a third gm stage (gm3) 2106, where $V_{RAMP}$ is stored by $C_{RAMP}$. More specifically, the switch 2108 is closed when $PWM_{INT}$ is high, resulting in $V_{RAMP}$ being charged high by the current outputs of the gm stages 2102, 2104, and 2106. More specifically, the gm stage 2102 converts the difference between $V_{IN}$ and 0 (provided by respective nodes 2112 and 2114) to current, the gm stage 2102 converts the difference between $V_{OUT}$ and 0 (provided by respective nodes 2116 and 2118) to current, and the gm stage 2102 converts the difference between 80 ns/Ts*$V_{IN}$ and 0 (provided by respective nodes 2120 and 2122) to current. In the mode controller scenario 2100, the input (80 ns/Ts*$V_{IN}$) applied to the gm stage 2106 increases with frequency, thus reducing $T_{ON}$ ripple.

In the mode controller scenario 2100, the gm stage 2102 is positive, and the gm stages 2104 and 2106 are negative. More specifically, the mode controller scenario 2100 represents $V_{RAMP}$ determined as gm1*$V_{IN}$–gm3*$V_{IN}$*80 ns–gm2*$V_{OUT}$. In one example (e.g., a 500 kHz clock frequency example), $V_{RAMP}$ is determined as gm1*$V_{IN}$ (0.97–0.75*$V_{OUT}/V_{IN}$). In another example (e.g., a 2200 kHz clock frequency example), $V_{RAMP}$ is determined as gm1*$V_{IN}$(0.83–0.75*$V_{OUT}/V_{IN}$). In the above example, the clock frequency (e.g., 2200 kHz or 500 kHz) determines the switching frequency of a converter (e.g., a buck converter).

In the mode controller scenario 2120, the same components are represented with $PWM_{INT}$ low. In such case, the switch 2018 is open and $V_{RAMP}$ is a function of the second gm stage 2104 and a third gm stage 2106, where $V_{RAMP}$ is stored by $C_{RAMP}$. More specifically, the switch 2108 is open when $PWM_{INT}$ is low, resulting in $V_{RAMP}$ (the voltage stored by $C_{RAMP}$) being a function of the gm stages 2104 and 2106. In the mode controller scenario 2120, the input (80 ns/Ts*$V_{IN}$) applied to the gm stage 2106 increases with frequency, thus reducing $T_{OFF}$ ripple.

In the mode controller scenario 2120, the gm stages 2104 and 2106 are negative. More specifically, the mode controller scenario 2120 represents $V_{RAMP}$ determined as 0–gm3*$V_{IN}$*80 ns–gm2*$V_{OUT}$. In one example (e.g., a 500 kHz), $V_{RAMP}$ is determined as gm1*0.75(–0.04*$V_{IN}$–$V_{OUT}$). In another example (e.g., a 2200 kHz example), $V_{RAMP}$ is determined as gm1*0.75(–0.13*$V_{IN}$–$V_{OUT}$).

In the mode controller scenario 2150, $V_{SLOPE}$ is a function of a first gm stage (gm2/2) 2152 and a second gain stage (gm3/2) 2154, where $V_{SLOPE}$ is stored by $C_{SLOPE}$ (where $C_{SLOPE}=C_{RAMP}/2$). In the mode controller scenario 2150, the input (80 ns/Ts*$V_{IN}$) applied to the gain stage 2154 increases with frequency, and corrects the slope amplitude.

Figure 22:
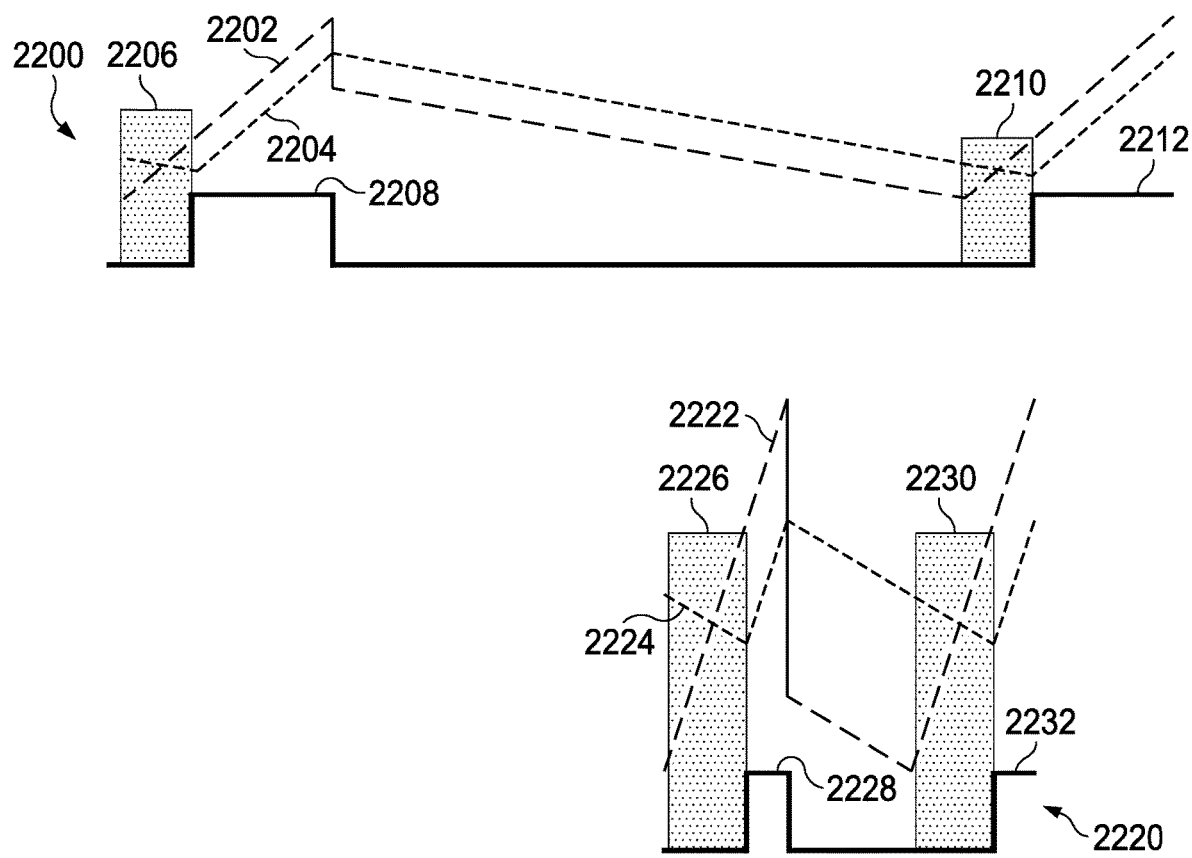
FIG. 22 includes graphs showing controller mode waveforms in accordance with various examples.

FIG. 22 includes graphs 2200 and 2220 showing controller mode waveforms in accordance with various examples. In graph 2200, a $V_{RAMP}$ waveform 2202 and an $I_L$ waveform 2204 are represented relative to pulses 2208 and 2212 of a $PWM_{INT}$ waveform. Also, graph 2200 includes areas of interest 2206 and 2210, where $V_{RAMP}$ 2202 and $I_L$ 2204 intersect. As represented in graph 2200, the effect of the 80 ns delay described previously increases $T_{ON}$ of the emulated pulse. The effect is not noticeable at lower frequencies.

In graph 2220, a $V_{RAMP}$ waveform 2222 and an $I_L$ waveform 2224 are represented relative to pulses 2228 and 2232 of a $PWM_{INT}$ waveform. Also, graph 2220 includes areas of interest 2226 and 2230, where $V_{RAMP}$ 2222 and $I_L$ 2224 intersect. As represented in graph 2220, at higher frequencies the ripple change is large.

Figure 23:
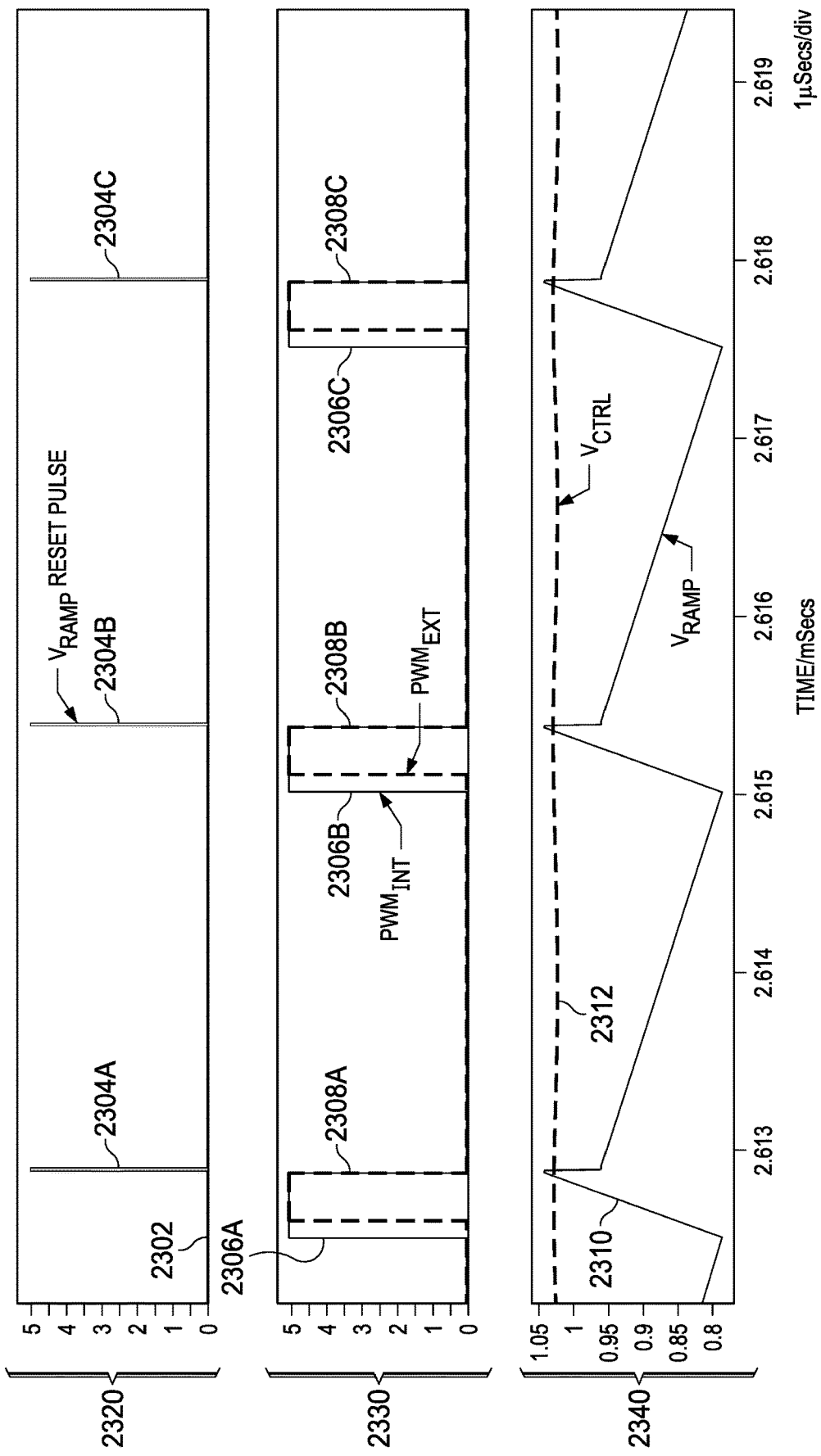
FIG. 23 is a graph showing mode controller waveforms when a converter is operating in continuous conduction mode (CCM) in accordance with various examples.

FIG. 23 is a graph 2300 showing mode controller waveforms when a converter (e.g., the ACM converter 102 in FIG. 1) is operating in CCM in accordance with various examples. In graph 2300, various timing diagrams 2320, 2330, and 2340 are represented to facilitate comparison of different waveforms, including a control voltage ($V_{CTRL}$) waveform 2312 and a ramp voltage ($V_{RAMP}$) waveform 2310 when a converter is operating in CCM. The graph 2300 also shows $V_{RAMP}$ reset pulses 2304A-2304C, $PWM_{INT}$ pulses 2306A-2306C, and $PWM_{EXT}$ pulses 2308A-2308C.

In some examples, because of the 25% offset between gm1 and gm2/gm3, the falling slope of the $V_{RAMP}$ signal 2310 is smaller than it needs to be to maintain the peak of $V_{RAMP}$ constant. Without the loop of gm4 (see the gain stage 740 in FIG. 7), $V_{RAMP}$ will continue go high. With the loop added by gm4, $R_{RST}$, $C_{RST}$, $S_{DCHG}$, and $S_{CHG}$ in FIG. 7, $V_{RAMP}$ is reset softly at the end of each PWM cycle by charge redistribution to a lower voltage than $V_{COM}$. In this way, both the peak of $V_{RAMP}$ and $V_{CTRL}$ is kept around $V_{COM}$. But because of the limited gain of this peak control loop, the final value of $V_{CTRL}$ is still a little higher than the $V_{COM}$. In graph 2300, the delay between $PWM_{INT}$ and $PWM_{EXT}$ can be seen clearly from this waveform.

Figure 24:
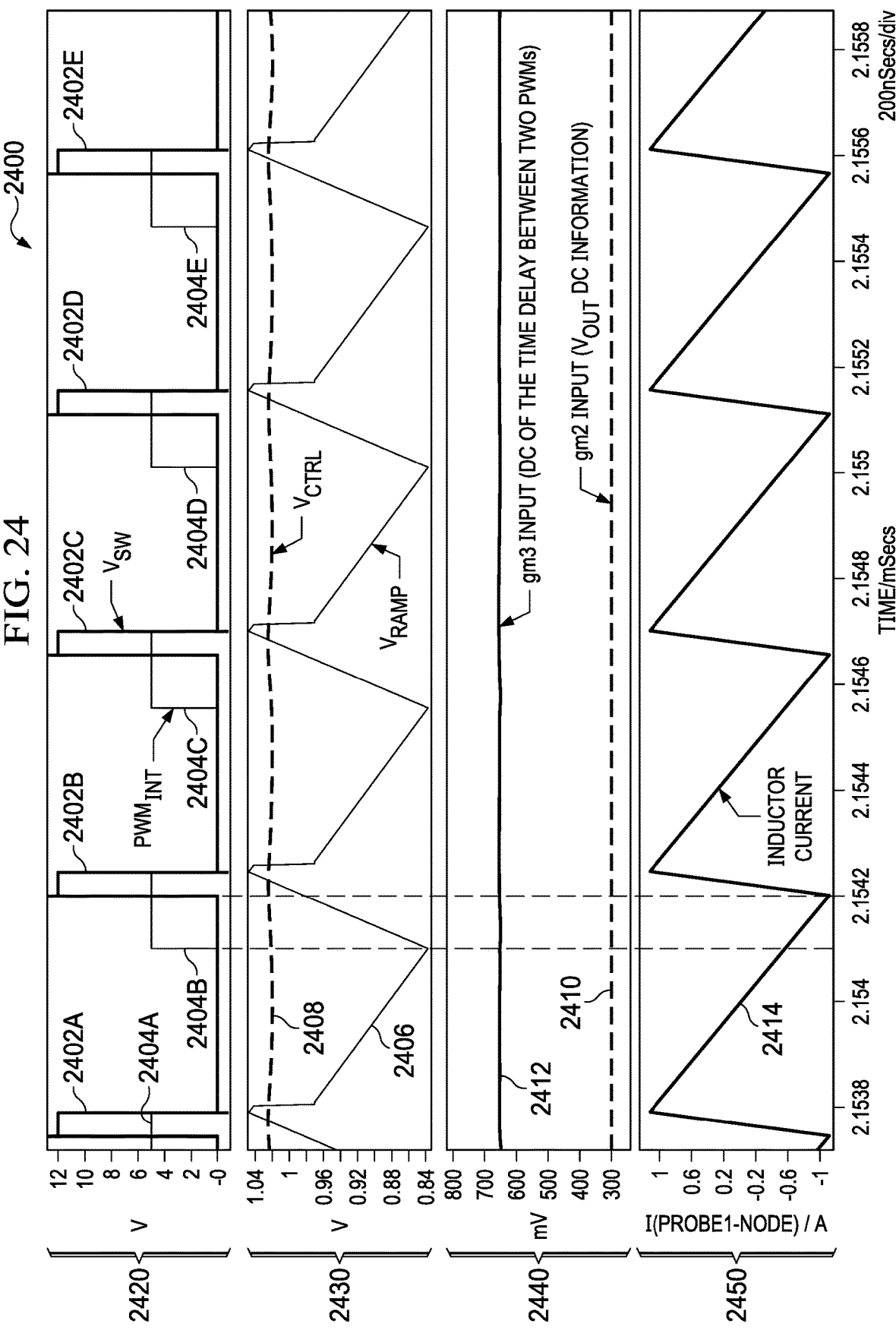
FIG. 24 is a graph showing internal mode controller waveforms for a given switching frequency in accordance with various examples.

FIG. 24 is a graph 2400 showing internal mode controller waveforms of a converter (e.g., the ACM converter 102 in FIG. 1) for a given switching frequency (e.g., 2.2 MHz) in accordance with various examples. In graph 2400 various waveforms are represented using timing diagrams 2420, 2430, 2440, and 2450. More specifically, the graph 2400 includes a control voltage ($V_{CTRL}$) waveform 2408 and a ramp voltage ($V_{RAMP}$) waveform 2406. The graph 2400 also shows $PWM_{INT}$ pulses 2404A-2404E, and $V_{SW}$ pulses 2402A-2402E. The graph 2400 also shows a representation of an inductor current 2414, a gm3 input 2412 (DC of the time delay between two PWMs), and a gm2 input 2410 ($V_{OUT}$ DC information).

For the graph 2400, when switching frequency is high, the fixed delay between $PWM_{INT}$ and the rising edge of $PWM_{EXT}$ ($V_{SW}$) is much larger than the ON time itself. Accordingly, $T_{ON}$ for $PWM_{INT}$ is much larger than $T_{ON}$ for $PWM_{EXT}$ and $V_{SW}$. This difference in $T_{ON}$ is shown in the rising slope of inductor current 2414 and the rising slope of $V_{RAMP}$ 2406 because the rising time of $V_{RAMP}$ is the $T_{ON}$ of $PWM_{INT}$. Meanwhile, the rising time of the inductor is the $T_{ON}$ of $PWM_{EXT}$ ($V_{SW}$).

For internal $V_{RAMP}$, since the $T_{ON}$ of $PWM_{INT}$=Delay+$T_{ON}$ of $V_{SW}$, gm3 is used to obtain the DC current from the delay. Also, gm2 is used to obtain the DC current from the $T_{ON}$ of $V_{SW}$. In this manner, $V_{RAMP}$ stays at balance between $T_{ON}$ and $T_{OFF}$. In the example of graph 2400, the input of the gm3 is around 650 mV and input of the gm2 is 300 mV (equal to $V_{OUT}/4$).

FIG. 25 is a graph 2500 showing mode controller waveforms when a converter (e.g., the ACM converter 102 in FIG. 1) is operating in DCM in accordance with various examples. In graph 2500, various signals are represented using timing diagrams 2520, 2530, 2540, and 2550. As shown, the graph 2500 includes an inductor current waveform 2502 and LSFET OFF signal pulses 2504A-2504D. Also, the graph 2500 shows representative $PWM_{INT}$ pulses 2506A-2506D and $PWM_{EXT}$ pulses 2508A-2508D. Also, the graph 2500 shows a $V_{RAMP}$ CCM waveform 2512, a $V_{RAMP}$ DCM waveform 2510, a $V_{CTRL}$ CCM waveform 2514, and a $V_{CTRL}$ DCM waveform 2516. When in DCM mode, the switching frequency is the same as CCM. However, in each cycle, there is a time period in which both high side FET (e.g., M1 in FIG. 2) and low side FET (e.g., M2 in FIG. 2) are off.

When the load current decreases, the inductor current 2502 also decreases. After a threshold number of zero crossing events happen, the converter is in DCM mode. In this mode, the low side FET (e.g., M2 in FIG. 2) will be turned off when the zero crossing of inductor current 2502 is detected. In graph 2500, the LSFET OFF pulses 2504A-2504C, and the inductor current waveform 2502 show this change. In graph 2500, the internal $V_{RAMP}$ DCM waveform 2510 does not have the tristate status. Also, when the $PWM_{INT}$ is low, $V_{RAMP}$ DCM waveform 2510 will go low. With the DCM mode in power stage and voltage loop of the controller, the $V_{CTRL}$ DCM waveform 2516 is lower than the $V_{CTRL}$ CCM waveform 2514. Also, the peak-to-peak voltage of the $V_{RAMP}$ DCM waveform 2510 is decreased compared the $V_{RAMP}$ CCM waveform 2512 because of the low voltage step during $V_{RAMP}$ reset. With lower load current, the control loop maintains balance at a narrower ON pulse width during DCM. With lower load current, the ON pulse width will continue getting narrower until the pulse skipping mode starts.

Figure 26:
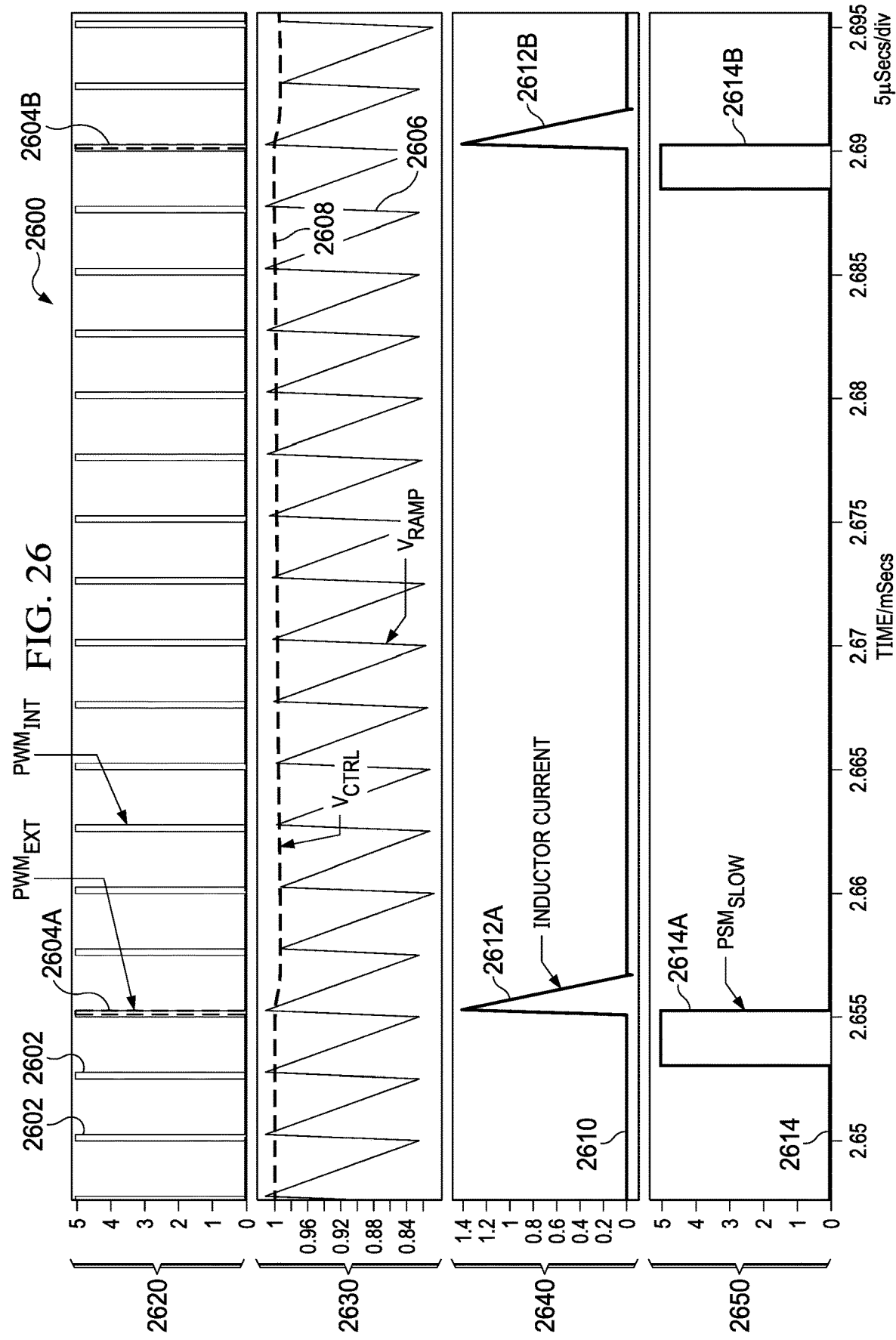
FIG. 26 is a graph showing mode controller waveforms when a converter is operating in pulse-skipping mode (PSM) in accordance with various examples.

FIG. 26 is a graph 2600 showing mode controller waveforms when a converter (e.g., the ACM converter 102 in FIG. 1) is operating in PSM in accordance with various examples. In graph 2600, various waveforms are represented using timing diagrams 2620, 2630, 2640, and 2650. More specifically, the waveforms in graph 2600 include $PWM_{INT}$ pulses 2602, $PWM_{EXT}$ pulses 2604A and 2604B, a $V_{RAMP}$ waveform 2606, a $V_{CTRL}$ waveform 2608, an inductor current waveform 2610 and related pulses 2612A and 2612B, and a $PSM_{SLOW}$ waveform 2614 and related pulses 2614A and 2614B.

In PSM, the switching frequency drops by skipping PWM pulses while load current gets smaller. When the load current further decreases, the inductor current also decreases. In DCM mode, $V_{CTRL}$ drops from a level corresponding to CCM to very close to $V_{COM}$, with decreasing inductor current. When $V_{CTRL}$ drops below $V_{COM}$, the converter enters PSM. In the graph 2600, $V_{COM}$ is 1V. Since gm4 is designed to be able to sink current only, when $V_{CTRL}$ drops below $V_{COM}$, gm4 is disabled naturally. Accordingly, the pulse width in PSM will not change with load current anymore.

When $V_{CTRL}$ is below $V_{COM}$, $PSM_{SLOW}$ stays low. This blocks $PWM_{INT}$ from passing to $PWM_{EXT}$. At this time, $V_{OUT}$ is higher than target voltage. While the small load current slowly pulls the $V_{OUT}$ down, $V_{CTRL}$ will increase. When $V_{OUT}$ drops below a target voltage, $V_{CTRL}$ will be higher than $V_{COM}$. In such case, $V_{TFF}$ will be higher than $V_{COM}$ too, and a $PSM_{SLOW}$ pulse (e.g., pulse 2614A or pulse 2614B) is triggered by this $V_{OUT}$ drop, resulting in sending $PWM_{INT}$ to $PWM_{EXT}$ in next cycle.

Figure 27:
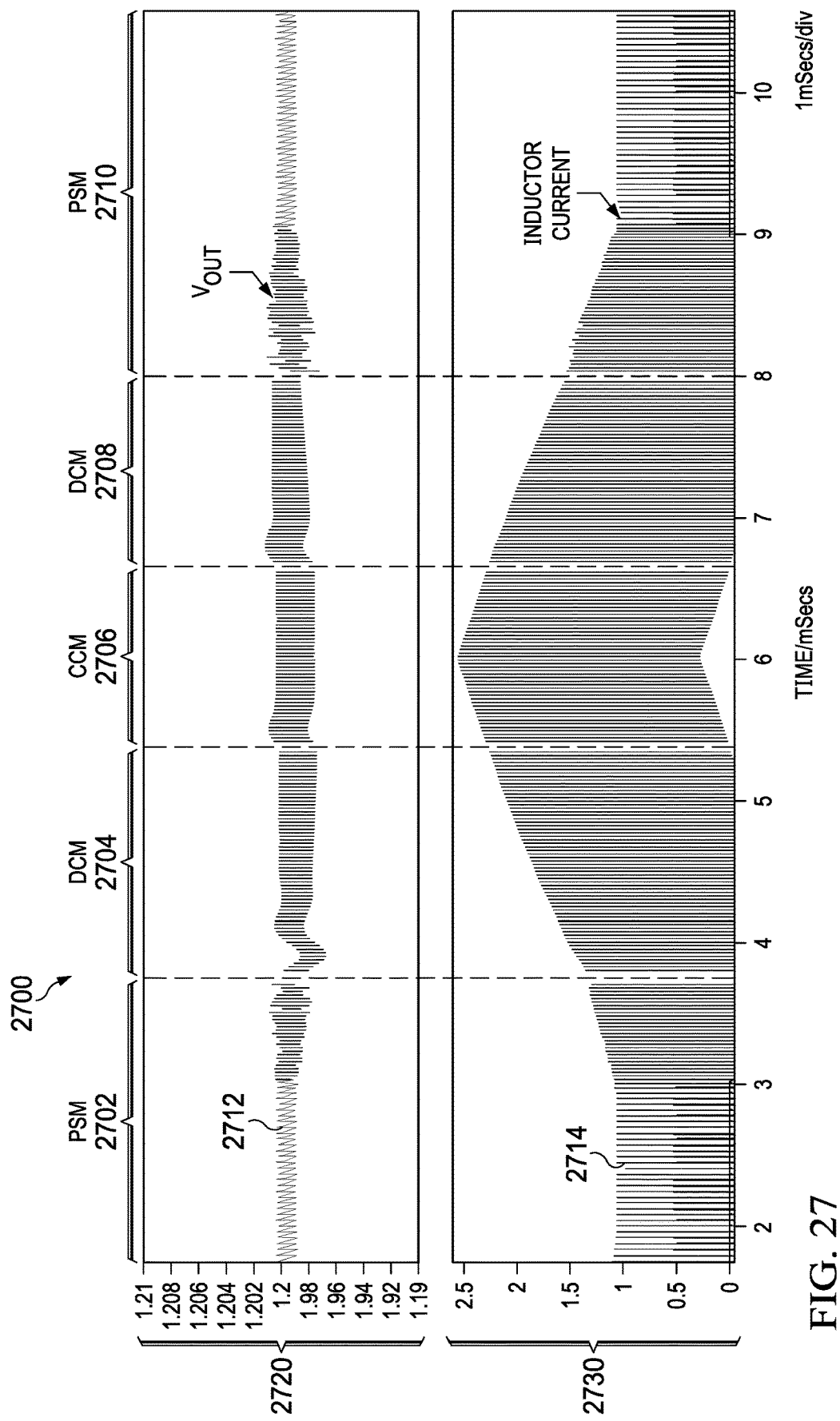
FIG. 27 is a graph showing transitions between CCM, DCM and PSM with output voltage ($V_{OUT}$) and inductor current changes in accordance with various examples.

FIG. 27 is a graph 2700 showing transitions between CCM, DCM and PSM with $V_{OUT}$ and inductor current changes in accordance with various examples. In graph 2700, timing diagrams 2720 and 2730 show a $V_{OUT}$ waveform 2712 and an inductor current waveform 2714 relative to mode intervals 2702, 2704, 2706, 2708, and 2710. More specifically, mode interval 2702 is a PSM interval, mode interval 2704 is a DCM interval, mode interval 2706 is a CCM interval, mode interval 2708 is a DCM interval, and mode interval 2710 in a PSM interval.

As shown in graph 2700, the transitions between CCM, DCM and PSM are slow and smooth transition, where the inductor current waveform 2714 slowly changes. In all of the three modes, $V_{CTRL}$ is always around $V_{COM}$. Accordingly, the disturbance on $V_{OUT}$ is very small while a converter (the ACM converter 102 in FIG. 1) does the mode change. In the example of graph 2700, the disturbance on $V_{OUT}$ is about 2 mV. Compared to a Burst mode PFM control option, the $V_{OUT}$ ripple using this method is small. As represented in graph 2700, the $V_{OUT}$ ripple in DCM and PSM are comparable to the $V_{OUT}$ ripple in CCM.

Figure 28:
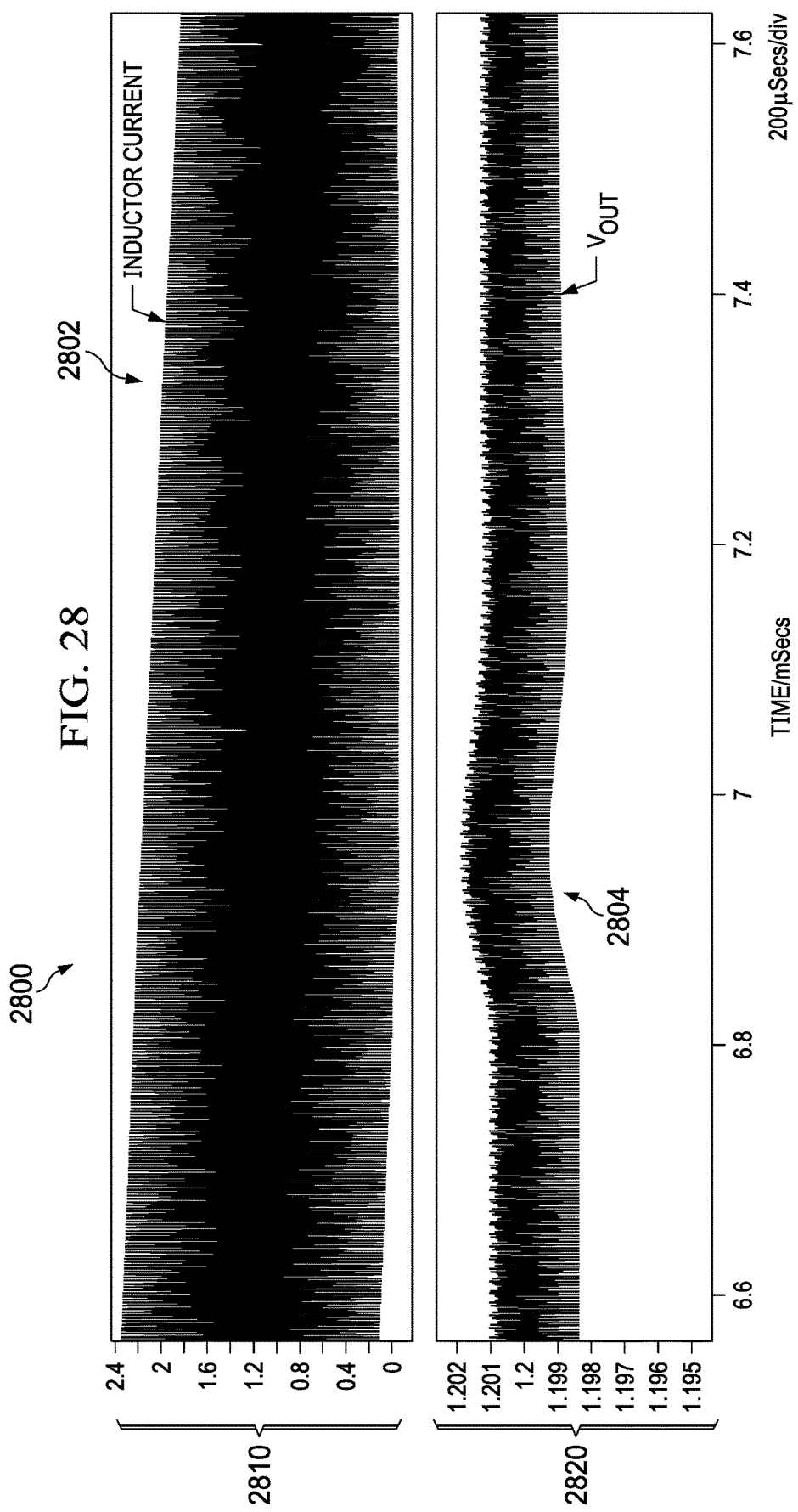
FIG. 28 is a graph showing inductor current and $V_{OUT}$ at the boundary of CCM and DCM in accordance with various examples.

FIG. 28 is a graph 2800 showing inductor current and $V_{OUT}$ at the boundary of CCM and DCM in accordance with various examples. In graph 2800, timing diagrams 2810 and 2820 show a $V_{OUT}$ waveform 2804 and an inductor current waveform 2802. In graph 2800, inductor current and $V_{OUT}$ details at the boundary of CCM and DCM are represented. As shown, the disturbance on $V_{OUT}$ at the boundary of CCM and DCM is very small.

Figure 29:
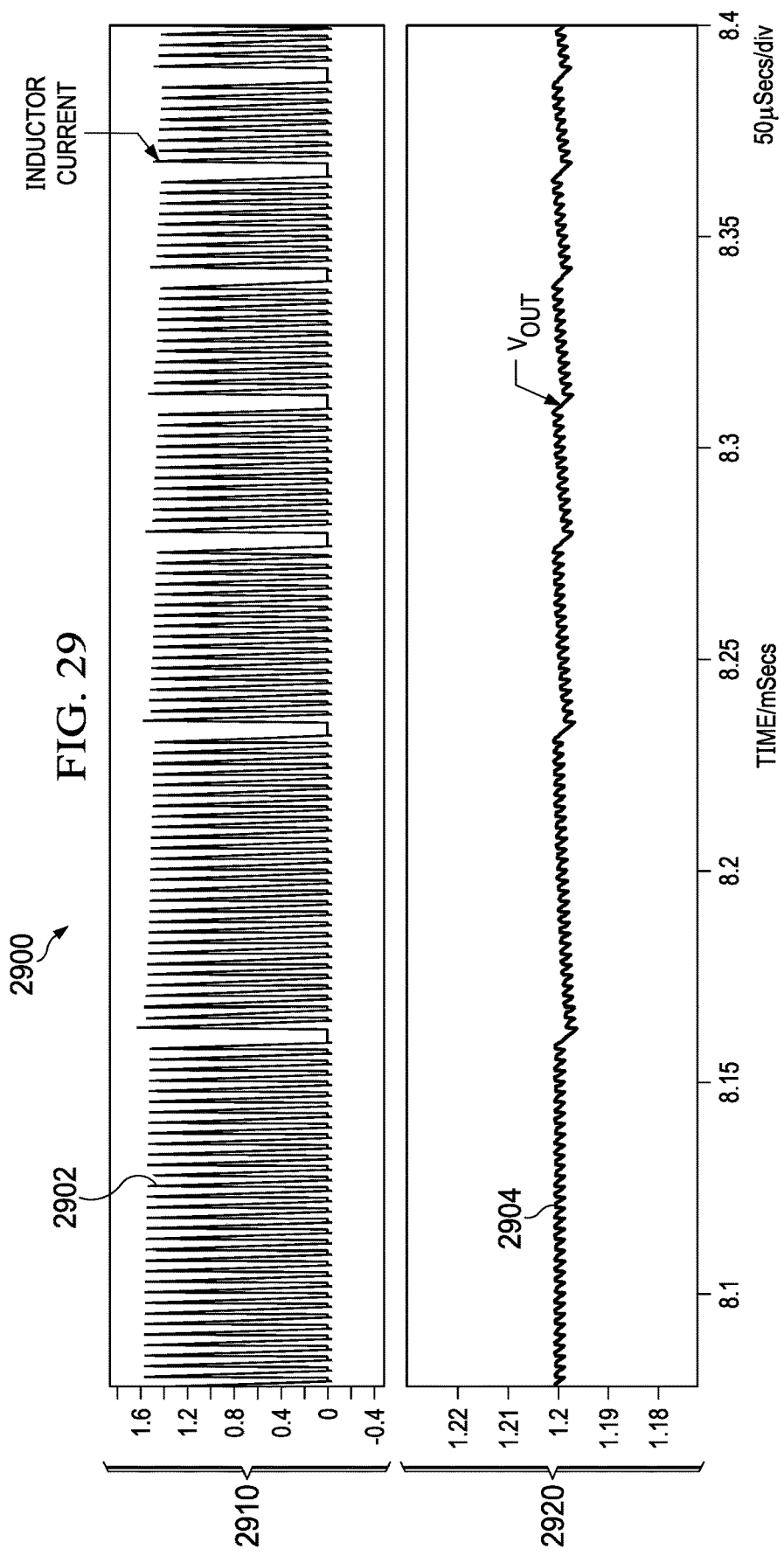
FIG. 29 is a graph showing inductor current and $V_{OUT}$ at the boundary of DCM and PSM in accordance with various examples.

FIG. 29 is a graph showing inductor current and $V_{OUT}$ at the boundary of DCM and PSM in accordance with various examples. In graph 2900, timing diagrams 2910 and 2920 show a $V_{OUT}$ waveform 2904 and an inductor current waveform 2902. As represented in graph 2900, with load current decrease, the PWM pulse starts to be skipped. With only one pulse skipped by the control loop, the $V_{OUT}$ ripple is still well controlled. With lower load current, the frequency of pulse skipping operations increases.

FIG. 30 is a graph 3000 showing inductor current and $V_{OUT}$ changes in PSM mode in accordance with various examples. In graph 3000, timing diagrams 3010 and 3020 show a $V_{OUT}$ waveform 3004 and an inductor current waveform 3002. As represented in graph 3000, with further decrease in load current, a converter (e.g., the ACM converter 102 in FIG. 1) changes smoothly from skipping one pulse to issuing one pulse at light load. In contrast to a Burst mode control options where multiple pulses are used, the disclosed DCM/PSM scheme always maintains small $V_{OUT}$ ripple. Thus, the transition between different modes is very smooth.

Figure 31:
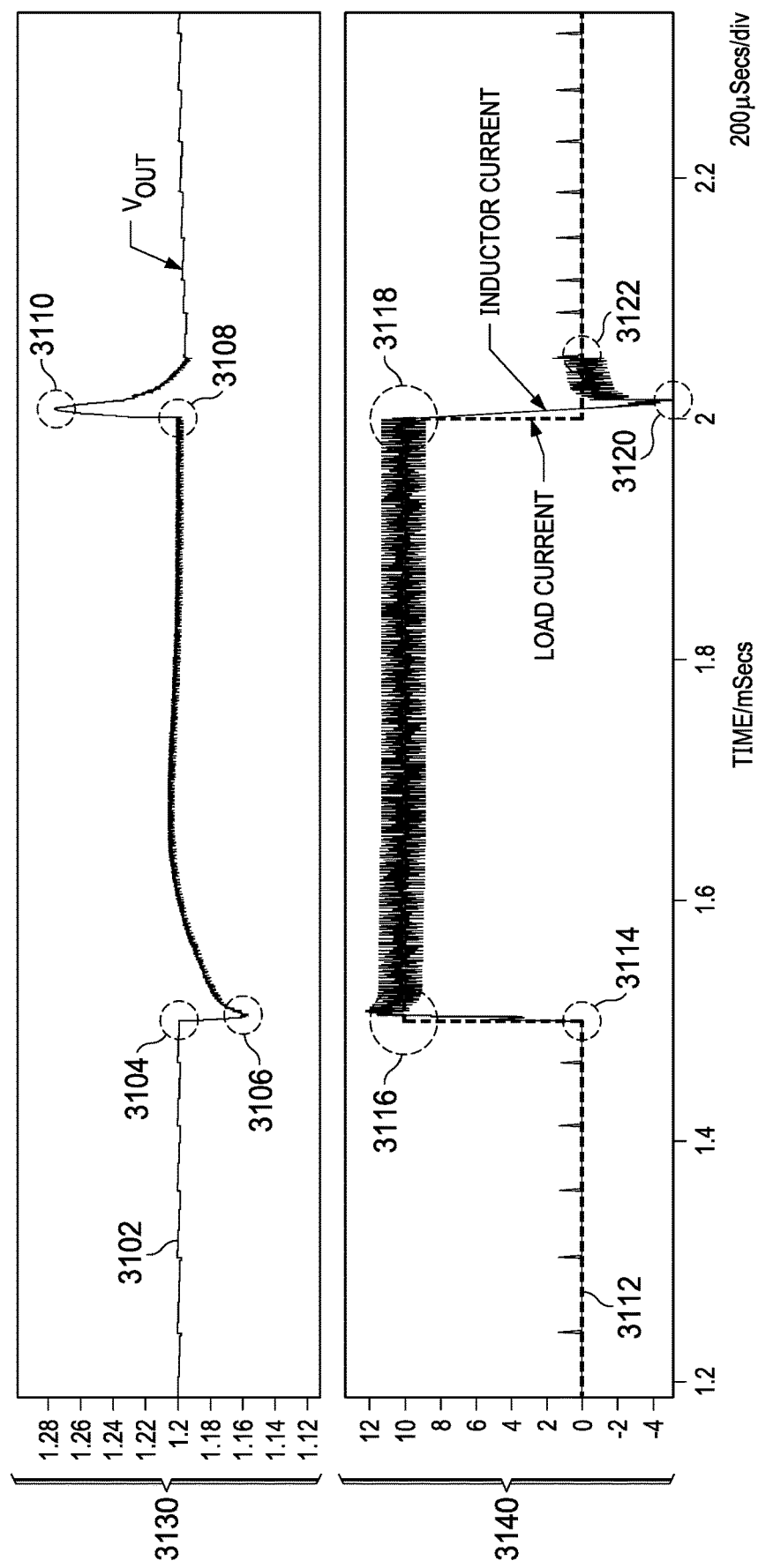
FIG. 31 is a graph showing the load step response of a mode controller in accordance with various examples.

FIG. 31 is a graph 3100 showing the load step response of a mode controller in accordance with various examples. In graph 3100, timing diagrams 3130 and 3140 show a $V_{OUT}$ waveform 3102 and an inductor current waveform 3112. In graph 3100, the fast load step response of a controller (e.g., the PSM transitions controller 104 in FIG. 1) is represented. With fast loop response, inductor current transitions (shown by inductor current transitions 3114, 3116, 3118, 3120, 3122) follow load current transitions quickly and $V_{OUT}$ dip and over shot are small. As shown, inductor current transitions 3114 and 3116 coincide with $V_{OUT}$ transitions 3104 and 3106. After load release, a converter (e.g., the ACM converter 102 in FIG. 1) stays in CCM for several cycles to pull $V_{OUT}$ down quickly with negative current (represented by $V_{OUT}$ transitions 3108 and 3110).

FIG. 32 is a graph 3200 showing a comparison of transients with and without a $PSMCMP_{FAST}$ comparator in accordance with various examples. In graph 3200, timing diagrams 3220 and 3230 show a $V_{OUT}$ without $PSM_{FAST}$ waveform 3202, a $V_{OUT}$ with $PSM_{FAST}$ waveform 3204, an inductor current without $PSM_{FAST}$ waveform 3210, an inductor current with $PSM_{FAST}$ waveform 3212, and a load current ($I_L$) waveform 3214.

In graph 3200, a transient comparison with and without the $PSMCMP_{FAST}$ comparator is provided. With a comparator to provide $PSM_{FAST}$ (e.g., the second comparator 1904 in FIG. 19), when the load transient is large, the comparator will be triggered. Upon such triggering, $PSM_{FAST}$ will go high and send $PWM_{INT}$ to $PWM_{EXT}$ immediately after the load current transient happens. Without a comparator to provide $PSM_{FAST}$, when the load transient is large, even $V_{OUT}$ already drops a lot, and the next $PWM_{EXT}$ cannot come before next CLOCK signal. In a worst-case scenario, $V_{OUT}$ will drop in a whole clock period before the next PWM signal pull it high. Accordingly, a comparator to provide the $PSM_{FAST}$ signal can help the load transient of the disclosed mode controller (e.g. the PSM transitions controller 104 in FIG. 1).

Without limitation to other features, the disclosed mode controller support CCM, DCM, and PSM transitions using the following features. A first feature involves changing an 80 ns delay between $PWM_{INT}$ and $PWM_{EXT}$ to an 80 ns pulse that is level shifted up to $V_{IN}$. The pulse is then filtered by a RC filter to obtain the average voltage. A gm stage changes this average from the 80 ns pulse to a discharge current to $V_{RAMP}$. See e.g., the gain and level shifter circuit 500 in FIG. 5. In some examples, a preset gm offset is used between the gm for $V_{IN}$, the gm for $V_{OUT}$, and the gm for the 80 ns pulse. The offset guarantees the pulse width in DCM and PSM is smaller than the pulse width in CCM to help a converter (e.g., the ACM converter 102 in FIG. 1) to have smooth transitions between modes.

Another feature is a soft reset loop to limit the average voltage of $V_{CTRL}$. The circuit 1201 in FIG. 12 show examples of soft reset loop components. This soft reset loop resets $V_{RAMP}$ by charge redistribution between two capacitors at the end of each internal PWM cycle. In the soft reset loop, gm4 can only sink current. Accordingly, gm4 will be naturally turned off when the converter is working in DCM or PSM mode.

Another feature is that $PWM_{INT}$ is always running in every clock cycle to drive $V_{RAMP}$. $PWM_{EXT}$ will be skipped according to load condition when the converter is in PSM mode. Another feature is that there are two DCM comparators to compare the $V_{TFF}$ and $V_{COM}$ (see e.g., FIG. 19). Another feature is that a comparator (e.g., comparator 1902 in FIG. 19) compares $V_{TFF}$ and $V_{COM}$ directly to provide $PSM_{SLOW}$, which is used to decide whether a $PWM_{INT}$ pulse in next clock cycle should be skipped or not. Another feature is that comparator (e.g., comparator 1904 in FIG. 19) compares $V_{TFF}$ and $V_{COM}+V_{OFFSET}$ to let the present cycle $PWM_{INT}$ be sent out to $PWM_{EXT}$ when the load transient is sufficiently large to pull $V_{OUT}$ low (below a threshold). In the manner, the control loop will respond to the transient immediately instead of waiting for next clock cycle.

Another feature is that disclosed DCM/PSM light load control solution works well with ACM, which is a true fixed frequency, internally compensated control with fast transient response. Another feature is well controlled operation points for the different modes, such that the disclosed DCM/PSM solution guarantees smooth and fast transitions between modes. Another feature involves either skipping one pulse or issuing only one pulse, such that this DCM/PSM solution avoids a multiple pulse scenario. Accordingly, $V_{OUT}$ ripple is kept low for different power system settings.

Another feature is that the output ripple of PSM is comparable to CCM, and sometimes even smaller. Another feature is that the control scheme either skips one pulse or issues one pulse for different system conditions. Another feature is that $V_{OUT}$ performance is predictable. Another feature is that control loop operation points are well maintained for CCM, DCM, and PSM. Because the operation points do not significantly change in the different modes, transitions between CCM, DCM, and PSM are smooth and fast.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A system, comprising:
   an input voltage supply;
   an advanced current mode (ACM) converter device coupled to the input voltage supply, wherein the ACM converter device comprises:
   a pulse-skipping mode (PSM) transitions controller configured to switch between a PSM and a discontinuous conduction mode (DCM) and includes two comparators configured to manage transitions between a continuous conduction mode (CCM), the DCM, and the PSM;
   a voltage loop circuit;
   a ramp loop circuit; and
   a loop comparator configured to combine voltage loop and ramp loop outputs to provide a loop comparator output; and a pulse-width modulation (PWM) circuit configured to generate a PWM signal based on the loop comparator output, wherein the loop comparator and the PWM circuit are part of the PSM transitions controller;
an output inductor coupled to a switch node of the ACM converter device;
an output capacitor with a first terminal coupled to the output inductor and a second terminal coupled to a ground node;
a voltage divider in parallel with the output capacitor, where the voltage divider is configured to provide a feedback voltage to the ACM converter device.

2. The system of claim 1, wherein the voltage loop circuit comprises:
an integrator; and
a gain and level shifter circuit configured to move a control voltage to a common voltage level for the DCM and the PSM, and configured to provide a feed forward voltage.

3. The system of claim 1, wherein the ramp loop circuit comprises:
a ramp generator configured to generate the ramp voltage around a common voltage; and
a slope compensation circuit configured to maintain slope compensation at a target value.

4. A system, comprising:
an input voltage supply;
an advanced current mode (ACM) converter device coupled to the input voltage supply, wherein the ACM converter device comprises:
a pulse-skipping mode (PSM) transitions controller configured to switch between a PSM and a discontinuous conduction mode (DCM) and includes a soft reset loop configured to limit an average control voltage ($V_{CTRL}$) and to reset a ramp voltage ($V_{RAMP}$) level by charge redistribution between two capacitors at the end of each internal PWM cycle;
a voltage loop circuit;
a ramp loop circuit;
a loop comparator; and
a pulse-width modulation (PWM) circuit configured to generate a PWM signal, wherein the loop comparator and the PWM circuit are part of the PSM transitions controller;
an output inductor coupled to a switch node of the ACM converter device;
an output capacitor with a first terminal coupled to the output inductor and a second terminal coupled to a around node; and
a voltage divider in parallel with the output capacitor, where the voltage divider is configured to provide a feedback voltage to the ACM converter device.

5. The system of claim 4, wherein the soft reset loop comprises a gain stage configured to only sink current and to turn off when the converter is in the DCM or the PSM.

6. A system, comprising:
an input voltage supply;
an advanced current mode (ACM) converter device coupled to the input voltage supply, wherein the ACM converter device comprises:
a pulse-skipping mode (PSM) transitions controller configured to switch between a PSM and a discontinuous conduction mode (DCM) and directs transitions between a continuous conduction mode (CCM), the DCM, and the PSM;
a voltage loop circuit;
a lamp loop circuit;
a loop comparator; and
a pulse-width modulation (PWM) circuit configured to generate a PWM signal, wherein the loop comparator and the PWM circuit, are part of the PSM transitions controller and wherein the PWM circuit is configured to generate a first PWM signal that runs in every clock cycle to drive the ramp voltage, and to generate a second PWM signal that is skipped according to a load condition when the ACM converter device is in the PSM;
an output inductor coupled to a switch node of the ACM converter device;
an output capacitor with a first terminal coupled to the output inductor and a second terminal coupled to a ground node;
a voltage divider in parallel with the output capacitor, where the voltage divider is configured to provide a feedback voltage to the ACM converter device; and
wherein the PSM transitions controller further comprises:
a first comparator configured to compare the feed forward voltage with a common voltage to decide whether the second PWM signal is skipped during a subsequent clock cycle; and a second comparator configured to compare the feed forward voltage with a common voltage plus an offset voltage to decide whether to prepare the second PWM signal for use in the subsequent clock cycle.

7. A system, comprising:
an input voltage supply;
an advanced current mode (ACM) converter device coupled to the input voltage supply, wherein the ACM converter device comprises:
a pulse-skipping mode (PSM) transitions controller configured to switch between a PSM and a discontinuous conduction mode (DCM) and directs transitions between a continuous conduction mode (CCM), the DCM, and the PSM;
a voltage loop circuit;
a ramp loop circuit;
a loop comparator; and
a pulse-width modulation (PWM) circuit configured to generate a PWM signal, wherein the loop comparator and the PWM circuit are part of the PSM transitions controller and wherein the PWM circuit is configured to generate a first PWM signal that runs in every clock cycle to drive the ramp voltage, and to generate a second PWM signal that is skipped according, to a load condition when the ACM converter device is in the PSM;
an output inductor coupled to a switch node of the ACM converter device;
an output capacitor with a first terminal coupled to the output inductor and a second terminal coupled to a around node;
a voltage divider in parallel with the output capacitor, where the voltage divider is configured to provide a feedback voltage to the ACM converter device; and
wherein a delay between the second PWM signal and the first PWM signal is changed to a pulse, is level shifted to a supply voltage, and is filtered by a RC filter to obtain an average control voltage, and wherein a gain stage changes the average control voltage from the pulse to a discharge current to the ramp loop circuit.

8. The system of claim 7, wherein the PSM transitions controller provides a preset gain offset between a gain for an input voltage (VIN), a gain for an output voltage (Vout), and a gain for the pulse to ensure a pulse width in the DCM and the PSM is smaller than a pulse width in the CCM.

* * * * *